United States Patent
Colburn et al.

(10) Patent No.: US 10,649,141 B1
(45) Date of Patent: May 12, 2020

(54) GRATINGS WITH VARIABLE ETCH HEIGHTS FOR WAVEGUIDE DISPLAYS

(71) Applicant: Facebook Technologies, LLC, Menlo Park, CA (US)

(72) Inventors: Matthew E. Colburn, Woodinville, WA (US); Giuseppe Calafiore, Redmond, WA (US); Matthieu Charles Raoul Leibovici, Seattle, WA (US); Nihar Ranjan Mohanty, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/960,312

(22) Filed: Apr. 23, 2018

(51) Int. Cl.
  *G02B 6/124* (2006.01)
  *G02B 6/34* (2006.01)
  *G02B 5/18* (2006.01)
  *G02B 27/01* (2006.01)
  *H01L 21/027* (2006.01)
  *H01J 37/305* (2006.01)
  (Continued)

(52) U.S. Cl.
  CPC .......... *G02B 6/124* (2013.01); *G02B 5/1857* (2013.01); *G02B 5/1861* (2013.01); *G02B 27/0172* (2013.01); *G02B 27/42* (2013.01); *H01J 37/3056* (2013.01); *H01L 21/0274* (2013.01); *G02B 2006/12107* (2013.01); *H01J 2237/0812* (2013.01)

(58) Field of Classification Search
  None
  See application file for complete search history.

(56) References Cited

U.S. PATENT DOCUMENTS

| | | | | |
|---|---|---|---|---|
| 5,575,878 A | * | 11/1996 | Cox | ..................... B29C 35/0888 156/220 |
| 6,545,808 B1 | * | 4/2003 | Ehbets | ................. G02B 5/1857 359/15 |
| 2009/0053656 A1 | | 2/2009 | Yanagisawa | |

(Continued)

FOREIGN PATENT DOCUMENTS

| CA | 2214927 A1 * | 4/1999 | .......... G02B 5/1857 |
|---|---|---|---|
| EP | 1160589 A1 | 12/2001 | |
| JP | 2007/328096 A | 12/2007 | |

OTHER PUBLICATIONS

Mosher, L. et al., "Double-Exposure Grayscale Photolithography," Journal of Microelectromechanical Systems, IEEE service Center, Apr. 1, 2009, vol. 18, No. 2, pp. 308-315.

(Continued)

*Primary Examiner* — Michelle R Connelly
(74) *Attorney, Agent, or Firm* — Fenwick & West LLP

(57) ABSTRACT

A manufacturing system performs a deposition of an etch-compatible film over a substrate. The etch-compatible film includes a first surface and a second surface opposite to the first surface. The manufacturing system performs a partial removal of the etch-compatible film to create a surface profile on the first surface with a plurality of etch heights relative to the substrate. The manufacturing system performs a lithographic patterning of a photoresist deposited over the created profile in the etch-compatible film to obtain the plurality of etch heights and one or more duty cycles corresponding to the etch-compatible film deposited over the substrate.

21 Claims, 15 Drawing Sheets

(51) Int. Cl.
*G02B 27/42* (2006.01)
*G02B 6/12* (2006.01)

(56) References Cited

U.S. PATENT DOCUMENTS

| | | | |
|---|---|---|---|
| 2009/0305507 A1* | 12/2009 | Suzuki | H01L 21/3065 |
| | | | 438/700 |
| 2013/0170043 A1 | 7/2013 | Ko | |
| 2013/0215406 A1 | 8/2013 | Heussler et al. | |
| 2018/0059304 A1* | 3/2018 | Bhargava | G02B 6/0035 |
| 2018/0095201 A1* | 4/2018 | Melli | G02B 6/124 |
| 2018/0129060 A1* | 5/2018 | Lee | G02B 5/1861 |

OTHER PUBLICATIONS

PCT International Search Report and Written Opinion, PCT Application No. PCT/US2019/026658, dated Aug. 19, 2019, 14 pages.

\* cited by examiner

GRATINGS WITH VARIABLE ETCH HEIGHTS FOR WAVEGUIDE DISPLAYS

BACKGROUND

The present disclosure generally relates to waveguide displays, and specifically to manufacturing optical grating elements with a variable etch heights and duty cycle.

Near-eye light field displays project images directly into a user's eye, encompassing both near-eye displays (NEDs) and electronic viewfinders. Conventional near-eye displays (NEDs) generally have a display element that generates image light that passes through one or more lenses before reaching the user's eyes. Additionally, NEDs in augmented reality systems are typically required to be compact and light weight, and to provide large exit pupil with a wide field-of-vision for ease of use. However, designing a conventional NED with materials of desired optical properties often results in a very low out-coupling efficiency of the image light received by the user's eyes due to mismatch in the size and shape of the grating element. While conventional lithography methods can produce optical grating elements with a variable duty cycle, such methods are incapable of modulating the height of the optical grating. Accordingly, there is a lack of a manufacturing system to fabricate optical grating elements with variable depths and duty cycles with a high throughput.

SUMMARY

Embodiments relate to a method of manufacturing an optical grating for an optical waveguide. In some embodiments, the manufacturing system for fabricating the optical grating includes a patterning system, a deposition system, and an etching system. The manufacturing system performs a lithographic patterning of one or more photoresists deposited over a substrate. The manufacturing system performs a deposition of at least one of: an etch-compatible film, a metal, a photoresist, or some combination thereof.

The manufacturing system performs a deposition of an etch-compatible film over a substrate. The manufacturing system performs a partial removal of the etch-compatible film to create a surface profile with a plurality of etch heights relative to the substrate. The manufacturing system performs a lithographic patterning of a photoresist deposited over the created profile in the etch-compatible film and an etching of the photoresist to obtain at least one of the plurality of etch heights and one or more duty cycles corresponding to the etch-compatible film deposited over the substrate.

Figure 1:
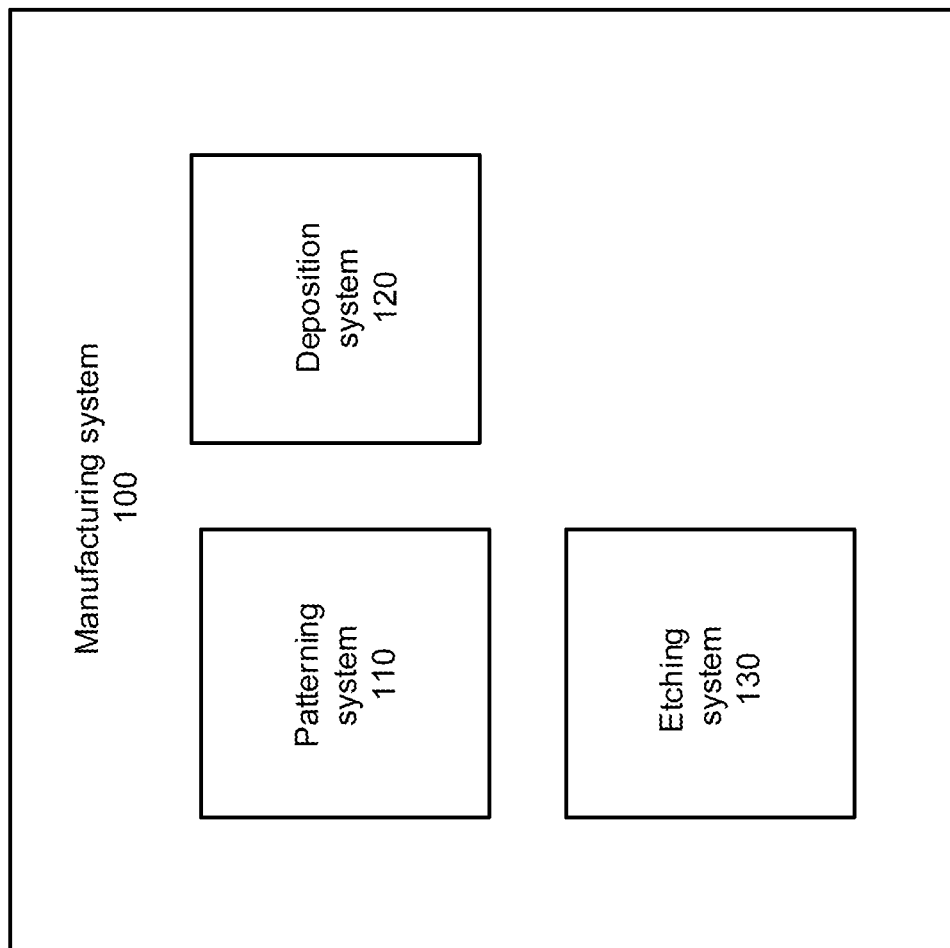
FIG. 1 is a block diagram of a manufacturing system, in accordance with one or more embodiments.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Overview

A manufacturing system for creating variable etch depth features in optical grating elements for optical waveguide displays. While conventional lithographic techniques (e.g. photolithography, electron-beam lithography, etc.) produce optical gratings with a highly customizable duty cycle by varying the size and/or spacing of such optical gratings, these lithographic techniques are not capable of modulating the vertical dimension (i.e. etch depth) of the optical grating relative to the substrate over the entire area of the substrate. Variable etch depth features can, e.g., control power being provided to various diffraction orders in, e.g., a diffraction grating. The manufacturing system uses a pattern (e.g., Chrome) on an etch-compatible film (e.g., Quartz) over a substrate to create uniform etch depth across the etch-compatible film. A grayscale photomask is used to create a modulated photoresist across the etch-compatible film, that when developed, creates variable etch heights and one or more duty cycles.

In some embodiments, the manufacturing system fabricates a nanoimprint mold with a constant etch height and one or more duty cycles. The manufacturing system deposits a photoresist over the nanoimprint mold. The manufacturing system performs a lithographic patterning of the photoresist with a gray-scale mask to create variable etch heights of the photoresist over the nanoimprint mold. The manufacturing system performs a partial etch back of the lithographically patterned photoresist based on the gray-scale mask to create a plurality of etch heights relative to the substrate.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1 is a block diagram of a manufacturing system 100, in accordance with one or more embodiments. The manufacturing system 100 is a set of systems that produces optical grating elements with an adjustable height and/or duty cycles in a waveguide display. In one embodiment, the manufacturing system 100 produces a gray-scale photomask based on a laser ablation process, as described below with reference to FIG. 4. The gray-scale photomask is used to fabricate optical gratings with different etch depths (e.g. few hundred nanometers to a few microns), one or more duty cycles (e.g. 10 percent to 90 percent), or some combination thereof. Such optical gratings cannot be formed using conventional lithographic techniques. In another embodiment, the manufacturing system 100 produces a gray-scale photomask based on a layer-by-layer deposition process, as described below with reference to FIG. 5A-B. In yet another embodiment, the manufacturing system 100 produces a gray-scale photomask based on a layer-by-layer etching process, as described below with reference to FIG. 6A-B. Some embodiments of the manufacturing system 100 have system components than those described here. Similarly, the functions can be distributed among the system components in a different manner than is described here. The manufacturing system 100 includes a patterning system 110, a deposition system 120, an etching system 130, or some combination thereof. The manufacturing system 100 may be similar to a system of fabricating devices used to form an integrated circuit, and may include such components as an etching component, a thin film manufacturing component, an oxidation component, and so on. In some embodiments, the manufacturing system 100 includes a controller (not shown here) that controls some or all of the systems in the manufacturing system 100.

The patterning system 110 is a system that performs a patterning of a substance formed on a substrate creating a change in geometry of the substance. In some embodiments, the patterning system 110 includes a convection oven, a hot plate, a cool plate, an infrared lamp, a wafer spinner, a mask aligner, an exposure system, a wet bench based developer system, or some combination thereof. In one example, the patterning system 110 includes a pair of convection ovens for processing batches of wafers through hard and soft baking for dehydration purposes at a temperature in the range of 150-200° C., a programmable wafer spinner, a contact-type mask aligner, and an exposure system with a mercury source of intensity close to 25 mW/cm$^2$.

In another embodiment, the patterning system 110 includes equipment performing at least one of: a laser ablation, an electron beam lithography, an interference lithography, a multi-photon lithography, a scanning probe lithography, or some combination thereof. In a first example, the patterning system 110 is based on electron beam lithography in which a focused beam of electrons performs a scanning of a desired shape on a surface covered with an electron-sensitive film. The focused electron beam changes the solubility of the electron-sensitive film resulting in a selective removal of either the exposed or unexposed regions of the electron-sensitive film by immersing in a solvent. In a second example, the patterning system 110 is based on interference lithography in which an interference pattern consisting of a periodic series of fringes representing intensity minima and maxima between two or more coherent light waves is set up and recorded in a light sensitive material. In some configurations, the patterning system 110 includes one or more devices performing two-beam interference lithography, a three-beam interference lithography, a four-beam interference lithography, a multi-wave interference lithography, or some combination thereof. Accordingly, the patterning system 110 may perform a lithographic patterning of an array of patterns with a hexagonal symmetry, a rectangular symmetry, an aperiodic pattern with a defined spatial frequency spectrum, or some combination thereof. In a third example, the patterning system 110 is based on multi-photon lithography in which a negative-tone or positive-tone photoresists is illuminated with light from a laser of well-defined wavelength without the use of any complex optical systems. The multi-photon lithography process is based on a multi-photon absorption process in a light-sensitive material that is transparent at the wavelength of the laser for creating the lithographic pattern. By scanning and properly modulating the laser, a chemical change occurs at the focal spot of the laser and can be controlled to create an arbitrary three-dimensional periodic or non-periodic pattern. In a fourth example, the patterning system 110 is based on scanning probe lithography in which a scanning probe microscope is used for directly writing the desired lithographic pattern on a light-sensitive material using heat, chemical reaction, diffusion, oxidation, electrical bias, mechanical force, or some combination thereof. In some configurations, the patterning system 110 includes one or more devices performing lithographic patterning on a photosensitive material at different locations simultaneously using different types of scanning probe microscope in a parallel fashion for high volume manufacturing.

In alternate embodiments, the patterning system 110 includes an imprinting system that performs a mechanical stamping of a pattern on a substrate. In one example, the imprinting system performs a transfer of a pattern onto the substrate based on a removal of a residual polymeric layer and a subsequent removal of features imprinted into the patterned substrate. The patterning system 110 includes a thermal imprinting system, an ultraviolet imprinting system, a jet and flash imprinting system, a reverse imprinting system, or some combination thereof. The thermal imprinting system is a system that applies a mechanical force on a pre-heated stamp against a thermoplastic polymer that was previously spin-coated on the substrate. The ultraviolet imprinting system is a system that applies an ultraviolet radiation on a low-viscosity, UV-curable polymer (e.g. PDMS, HSQ) to cross-link the polymer followed by releasing the etch-compatible film from the substrate. The jet and flash imprinting system is a system that dispenses the polymer on the substrate through one or more ink-jets at a low pressure and temperature compared to the thermal imprinting system and the ultraviolet imprinting system. The reverse imprinting system is a system that coats a polymer directly onto a template and releases the patterned substrate by tuning the surface energies of the template and the substrate.

The deposition system 120 is a system that adds one or more thin films of materials on the substrate patterned by the patterning system 110. In some embodiments, the deposition system 120 adds a plurality of thin films of materials to form the stack with a gradient of refractive indices along any direction based on the differences between the refractive indices of two adjacent layers of materials. The deposition system 120 adds the thin films of materials on the substrate based on a physical vapor deposition, a chemical vapor deposition, an atomic layer deposition, a spin coating system, or some combination thereof, as described below in conjunction with FIG. 5. In some configurations, the deposition system 120 deposits thin films of materials selected from a group consisting of: an organic polymer, a dielectric layer, or some combination thereof. For example, the deposition system 120 deposits one or more layers of silicon di-oxide, SSQ derivatives, an organic polymer, titanium di-oxide, hafnium di-oxide, silicon nitride, or some combination thereof.

The deposition system 120 may include an electron-beam evaporator, a magnetron sputter, a reactive sputter, a low pressure chemical vapor deposition (LPCVD) reactor, a plasma-enhanced chemical vapor deposition (PECVD) reactor, an atomic layer deposition (ALD) reactor, or some combination thereof. The electron-beam evaporator is based on a form of physical vapor deposition in which a target anode is bombarded with an electron beam given off by a charged tungsten filament under high vacuum. The electron beam causes atoms from the target to transform into the gaseous phase. The atoms from the target then precipitate into a solid form, coating everything in the vacuum chamber within line of sight with a thin layer of the anode material. The magnetron sputter uses a strong electric and magnetic fields to confine charged plasma particles close to the surface of the sputter target. In a magnetic field, electrons follow helical paths around magnetic field lines, undergoing more ionizing collisions with gaseous neutrals near the target surface than would otherwise occur. The reactive sputter is based on the sputtered particles undergoing a chemical reaction before coating the substrate. The chemical reaction that the particles undergo is with a reactive gas introduced into the sputtering chamber such as oxygen or nitrogen. The low pressure chemical vapor deposition (LPCVD) reactor is based on a chemical process at a pressure lower than the atmospheric pressure in which the substrate is exposed to one or more volatile precursors which react and/or decompose on the substrate surface to produce the desired deposit. The plasma-enhanced chemical vapor deposition (PECVD) is based on a chemical process that utilizes plasma to enhance the chemical reaction rates of the volatile precursors allowing deposition at lower temperatures. In some configurations, the deposition system 120 performs the deposition of organic coatings such as plasma polymers at a temperature relatively lower than the room temperature. The atomic layer deposition (ALD) reactor is based on a chemical process in which alternating monolayers of two elements are deposited onto a substrate by alternatively pulsing the chemical reactants in a reaction chamber and then chemisorbing in a saturated manner on the surface of the substrate, forming a chemisorbed monolayer. In some configurations, the deposition system 120 includes a controller (not shown here) that controls a number of cycles of pulsing the precursors into the reaction chamber, the deposition time for each pulsing, and the time for purging the reaction chamber after each pulsing.

The deposition system 120 may also deposit an etch-compatible film of a target value of thickness over a substrate. The etch-compatible film may be composed of materials including, but not restricted to metals or metallic compounds (e.g. TiOx, WC, W, Cr, TiN, etc.), silicon containing materials (e.g. SiO2, Si3N4, SiON, SiC), carbon containing materials (e.g. amorphous carbon, diamond like carbon, spin on carbon) epoxy resins (e.g. SU-8), novolac resins, etc.

The etching system 130 is a system that removes one or more thin films of materials deposited on the substrate patterned by the patterning system 110. The etching system 130 is based on a physical process, a chemical process, or some combination thereof. The etching system 130 selectively removes a first set of one or more thin films of materials at a different rate of removal when compared to a second set of one or more thin films of materials in a multi-layered stack of materials deposited on the substrate. The etching system 130 includes a wet bench, an ion milling module, a plasma based reactive ion etching module, a chemical mechanical polishing module, or some combination thereof. In a first configuration, the etching system 130 includes a wet bench which performs a chemical etching using a combination of acids, bases, and solvents at a range of temperatures and concentrations. In a second configuration, the etching system 130 includes an ion milling module that performs a physical removal of a portion of the thin films deposited on the substrate at an extremely low pressure and using a high accelerating potential in order to accelerate electrons impacting the neutral gas atoms with enough energy to ionize the gas atoms. In a third configuration, the etching system 130 includes a plasma based reactive ion etching (RIE) module based on a chemically reactive plasma at a low pressure and an external electromagnetic field to remove one or more thin films of material deposited on the substrate. In a fourth configuration, the etching system 130 includes a chemical mechanical polishing (CMP) module that performs smoothening of one or more thin films of materials based on a combination of chemical and mechanical forces. In some examples, the etching system 130 uses an abrasive and corrosive chemical slurry along with a polishing pad and retaining ring to perform the chemical mechanical polishing on one or more thin films deposited on the substrate patterned by the patterning system 110.

In some embodiments, the etching system 130 is based on a Gas Cluster Ion Beams (GCIB) process that bombards a surface with a beam of high energy nanoscale cluster ions. In the GCIS process, an expansion takes place inside of a nozzle that shapes the gas flow and facilitates the formation of a jet of clusters. The jet of clusters passes through differential pumping apertures into a region of high vacuum where the clusters are ionized by collisions with energetic electrons. The ionized clusters are accelerated electrostatically to very high velocities, and they are focused into a tight beam. In one example, an etch-compatible film is partially removed by the Gas Cluster Ion Beams (GCIB) process by bombarding a surface of the etch-compatible film with a beam of high energy nanoscale cluster ions.

Figure 2A:
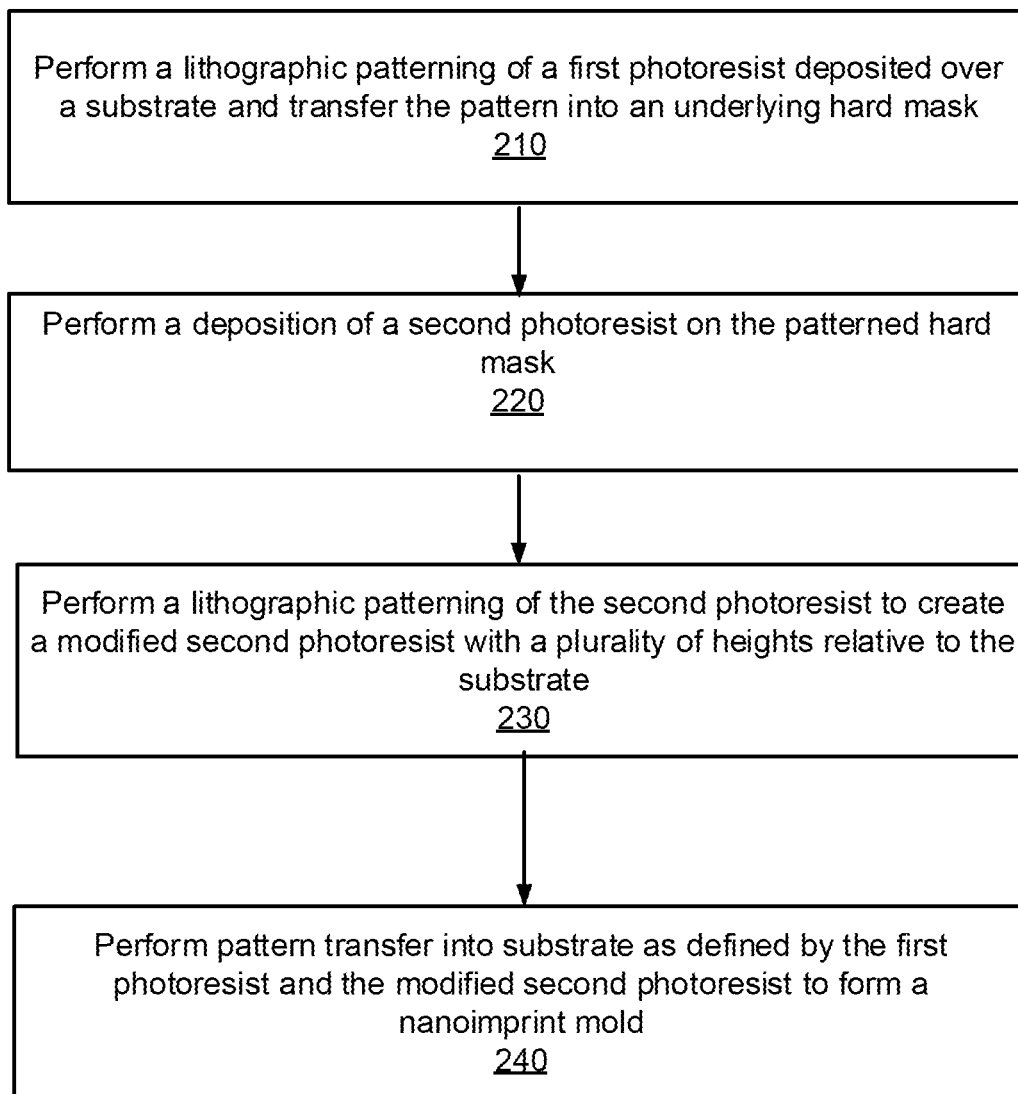
FIG. 2A is a flowchart illustrating the process of fabricating grating elements with a variable height performed by the manufacturing system of FIG. 1, in accordance with one or more embodiments.

FIG. 2A is a flowchart 200 illustrating the process of fabricating grating elements with a variable height performed by the manufacturing system 100 of FIG. 1, in accordance with one or more embodiments. Other entities may perform some or all of the steps of the process in other embodiments. Likewise, embodiments may include different and/or additional steps, or perform the steps in different orders.

The manufacturing system 100 performs 210 a lithographic patterning of a first photoresist deposited over a substrate and transfer the pattern into an underlying hard mask. As described above with reference to FIG. 1, the patterning system 110 performs 210 a photolithographic patterning of a first photoresist deposited by the deposition system 120 over the substrate and transfers the pattern into an underlying hard mask. In one example, the patterning system 110 includes a convection oven for dehydration of the substrate at 150-200° C., a wafer spinner for coating the substance on the substrate, a mask aligner for defining the lithographic pattern on the substrate, and an exposure system for transferring the lithographic pattern in the mask to the substrate. In some embodiments, the patterning system 110 performs 210 a lithographic patterning of a hard mask deposited over the one or more photoresists prior to the lithographic patterning of the one or more photoresists.

The manufacturing system 100 performs 220 a deposition of a second photoresist on the patterned hard mask. As described above with reference to FIG. 1, the deposition system 120 deposits the second photoresist comprising one or more layers of SSQ derivatives, an organic polymer, or some combination thereof. The deposition system 120 deposits the second photoresist with a thickness ranging from few hundred nanometers to few microns.

The manufacturing system 100 performs 230 a lithographic patterning of the second photoresist to create a modified second photoresist with a plurality of heights relative to the substrate. As described above with reference to FIG. 1, the patterning system 110 performs 230 a lithographic patterning of the second photoresist deposited by the deposition system 120 over the patterned first photoresist. In some embodiments, the manufacturing system 100 performs 230 the lithographic patterning of the second photoresist such that the modified second photoresist has a plurality of heights relative to the substrate in the range of few hundred nanometers to few microns.

The manufacturing system 100 performs 240 a pattern transfer into the substrate based on the first photoresist and the heights in the modified second photoresist to form a nanoimprint mold. The nanoimprint mold is a structure having a plurality of heights, and formed on the substrate by the manufacturing system 100. As described below in conjunction with FIG. 3C, the manufacturing system 100 transfers the structure with the plurality of heights on the nanoimprint mold on to an organic material (e.g. nanoimprint resin), and the manufacturing system 100 forms an optical grating on an optical waveguide. For example, the structure may include a plurality of pillars (or rows in a 1D case) that each have a respective height measured from the substrate. And at least one, and generally more than one pillar, has height that is different from at least one other pillar of the plurality of pillars. In some configurations, the etching system 130 performs 240 a partial removal of a substrate made of Quartz using a Quartz etch recipe with an etch rate of few Angstroms per second to achieve a target height of ~300 nm. The quartz etch recipe could involve single or multitude of fluorine containing gases (e.g. $CF_4$, $CHF_3$, $CH_2F_2$, $CH_3F$, $SF_6$, $NF_3$, $C_4F_8$, $C_4F_6$, $C_3F_8$, $F_2$, $ClF_3$, HF, etc.) and other additives (e.g. Ar, He, Ne, Kr, $O_2$, $N_2$, $N_2O$, $CH_4$, $SiCl_4$, $SiF_4$, $NH_3$, etc.).

Note that conventional lithographic techniques such as photolithography or electron beam lithography cannot modulate the heights of the modified second photoresist, and accordingly, the optical grating formed using such conventional lithographic techniques cannot modulate the heights of the optical grating relative to the substrate. In contrast, the manufacturing system 100 modulates the duty cycles (e.g. 10 percent to 90 percent), heights of the optical grating formed relative to the substrate, or some combination thereof. For example, the optical grating may include a plurality of pillars (or rows in 1D case) that each have a respective height measured from the substrate. And at least one, and generally more than one pillar, has height that is different from at least one other pillar of the plurality of pillars.

Figure 2B:
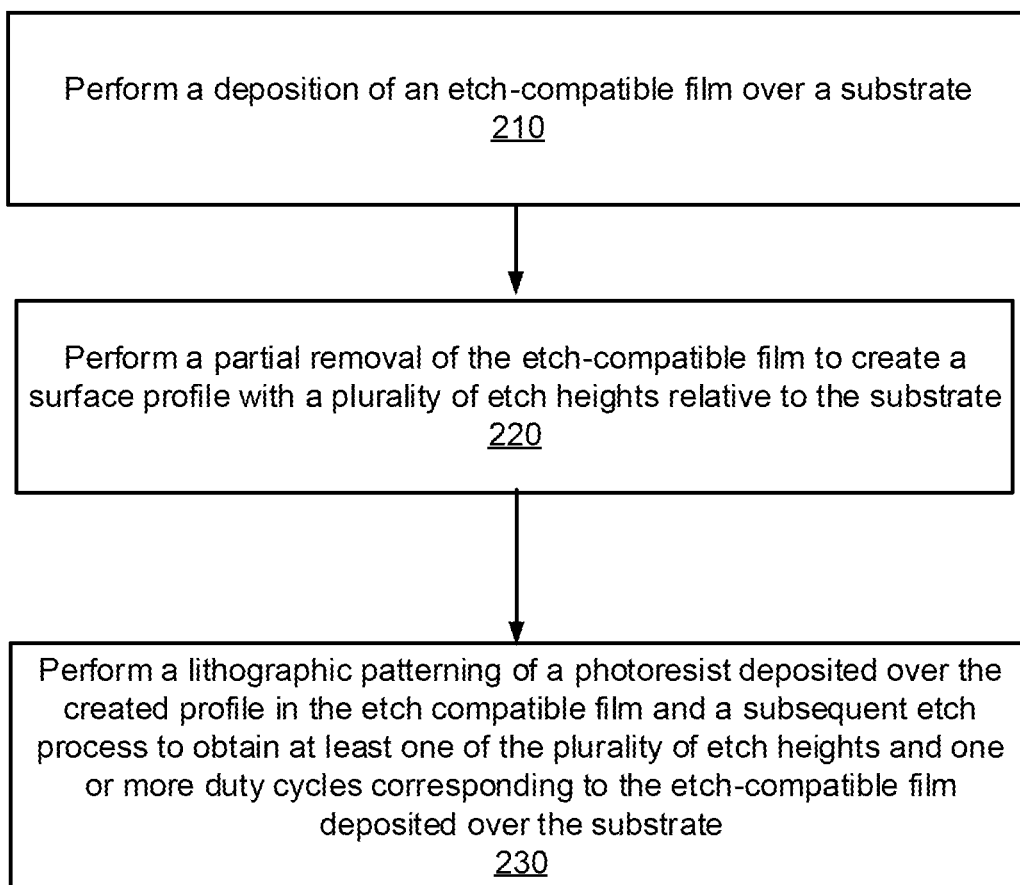
FIG. 2B is a flowchart illustrating the process of fabricating grating elements with a variable height and one or more duty cycles performed by the manufacturing system of FIG. 1, in accordance with one or more embodiments.

FIG. 2B is a flowchart 202 illustrating the process of fabricating grating elements with a variable height and one or more duty cycles performed by the manufacturing system 100 of FIG. 1, in accordance with one or more embodiments. Other entities may perform some or all of the steps of the process in other embodiments. Likewise, embodiments may include different and/or additional steps, or perform the steps in different orders.

The manufacturing system 100 performs 210 a deposition of an etch-compatible film over a substrate. As described above with reference to FIG. 1, the deposition system 100 deposits the etch-compatible film of a target value of thickness over a substrate. The etch-compatible film may be composed of materials including, but not restricted to metals or metallic compounds (e.g. $TiO_x$, WC, W, Cr, TiN, etc.), silicon containing materials (e.g. $SiO_2$, $Si_3N_4$, SiON, SiC), carbon containing materials (e.g. amorphous carbon, diamond like carbon, spin on carbon) epoxy resins (e.g. SU-8), novolac resins, etc. For example, the manufacturing system 100 performs 210 a deposition of a 300 nm Si3N4 film over a substrate.

The manufacturing system 100 performs 220 a partial removal of the etch-compatible film to create a surface profile with a plurality of etch heights relative to the substrate. As described below with reference to FIG. 7, the manufacturing system 100 performs 220 the partial removal of the etch-compatible film to achieve a plurality etch heights in the range of few hundred nanometers to few microns relative to the substrate. In some configurations, the manufacturing system 100 uses an ion-beam assisted etching tool to partially remove the etch-compatible film at one or more locations.

The manufacturing system 100 performs 230 a lithographic patterning of a photoresist deposited over the created profile in the etch-compatible film to obtain at least one of the plurality of etch heights and one or more duty cycles corresponding to the etch-compatible film deposited over the substrate. In one example, the patterning system 110 performs 230 the lithographic patterning using a convection oven for dehydration of the substrate at 150-200° C., a wafer spinner for coating the substance on the substrate, a mask aligner for defining the lithographic pattern on the substrate, and an exposure system for transferring the lithographic pattern in the mask to the substrate.

Note that conventional lithographic techniques such as photolithography or electron beam lithography cannot modulate the etch heights of the photoresist deposited over the created profile in the etch-compatible film, and accordingly, the optical grating formed using such conventional lithographic techniques cannot modulate the etch heights of the optical grating relative to the substrate. In contrast, the manufacturing system 100 modulates the duty cycles (e.g. 10 percent to 90 percent), etch heights of the optical grating formed relative to the substrate, or some combination thereof. For example, the optical grating may include a plurality of pillars (or rows in 1D case) of the etch-compatible film that each have a respective height measured from the substrate. And at least one, and generally more than one pillar, has height that is different from at least one other pillar of the plurality of pillars.

Figure 2C:
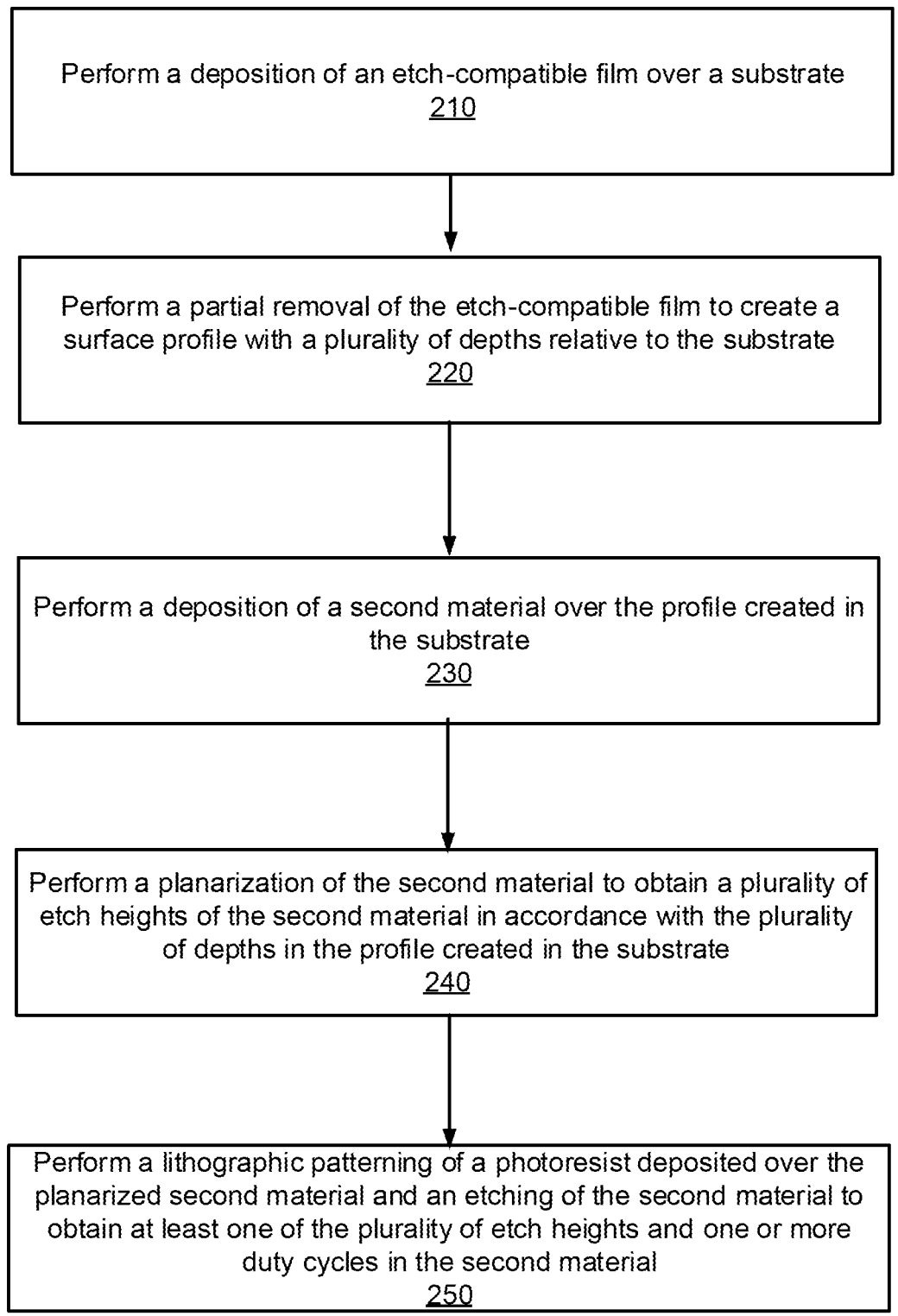
FIG. 2C is a flowchart illustrating the process of fabricating grating elements with a variable height and one or more duty cycles performed by the manufacturing system of FIG. 1, in accordance with one or more embodiments.

FIG. 2C is a flowchart 204 illustrating the process of fabricating grating elements with a variable height and one or more duty cycles performed by the manufacturing system 100 of FIG. 1, in accordance with one or more embodiments. Other entities may perform some or all of the steps of the process in other embodiments. Likewise, embodiments may include different and/or additional steps, or perform the steps in different orders.

The manufacturing system 100 performs 210 a deposition of an etch-compatible film over a substrate. As described above with reference to FIG. 1, the deposition system 100 deposits the etch-compatible film of a target value of thickness over a substrate. The etch-compatible film may be composed of materials including, but not restricted to, epoxy resins (e.g. SU-8), novolac resins, etc. The manufacturing system 100 performs 220 a partial removal of the etch-compatible film to create a surface profile with a plurality of depths relative to the substrate. In some configurations, the manufacturing system 100 uses an ion-beam assisted etching tool to partially remove the etch-compatible film at one or more locations. The manufacturing system 100 performs 230 a deposition of a second material over the profile created in the etch-compatible film. As described above with reference to FIG. 1, the deposition system 100 deposits the second material of a target value of thickness over the profile created in the etch-compatible film. The second material may be composed of materials including, but not restricted to, epoxy resins (e.g. SU-8), novolac resins, SSQ derivatives, etc.

The manufacturing system 100 performs 240 a planarization of the second material to obtain a plurality of etch heights of the second material in accordance with the plurality of depths in the profile created in the etch-compatible film. In one example, the manufacturing system 100 performs a chemical mechanical polishing of the deposited second material to achieve a target value of thickness and surface roughness of the second material. The manufacturing system 100 performs 250 a lithographic patterning of a photoresist deposited over the planarized second material and a subsequent etching of the second material (with high selectivity to the first material) to obtain at least one of the plurality of etch heights and one or more duty cycles in the second material. In one example, the patterning system 110 performs 250 the lithographic patterning using a convection oven for dehydration of the substrate at 150-200° C., a wafer spinner for coating the substance on the substrate, a mask aligner for defining the lithographic pattern on the substrate, and an exposure system for transferring the lithographic pattern in the mask to the substrate.

Note that conventional lithographic techniques such as photolithography or electron beam lithography cannot modulate the etch heights of the photoresist deposited over the planarized second material, and accordingly, the optical grating formed using such conventional lithographic techniques cannot modulate the etch heights of the optical grating relative to the substrate. In contrast, the manufacturing system 100 modulates the duty cycles (e.g. 10 percent to 90 percent), etch heights of the optical grating formed, or some combination thereof. For example, the optical grating may include a plurality of pillars (or rows in 1D case) that each have a respective height of the second material measured from the etch-compatible film. And at least one, and generally more than one pillar, has height that is different from at least one other pillar of the plurality of pillars.

Figure 3A:
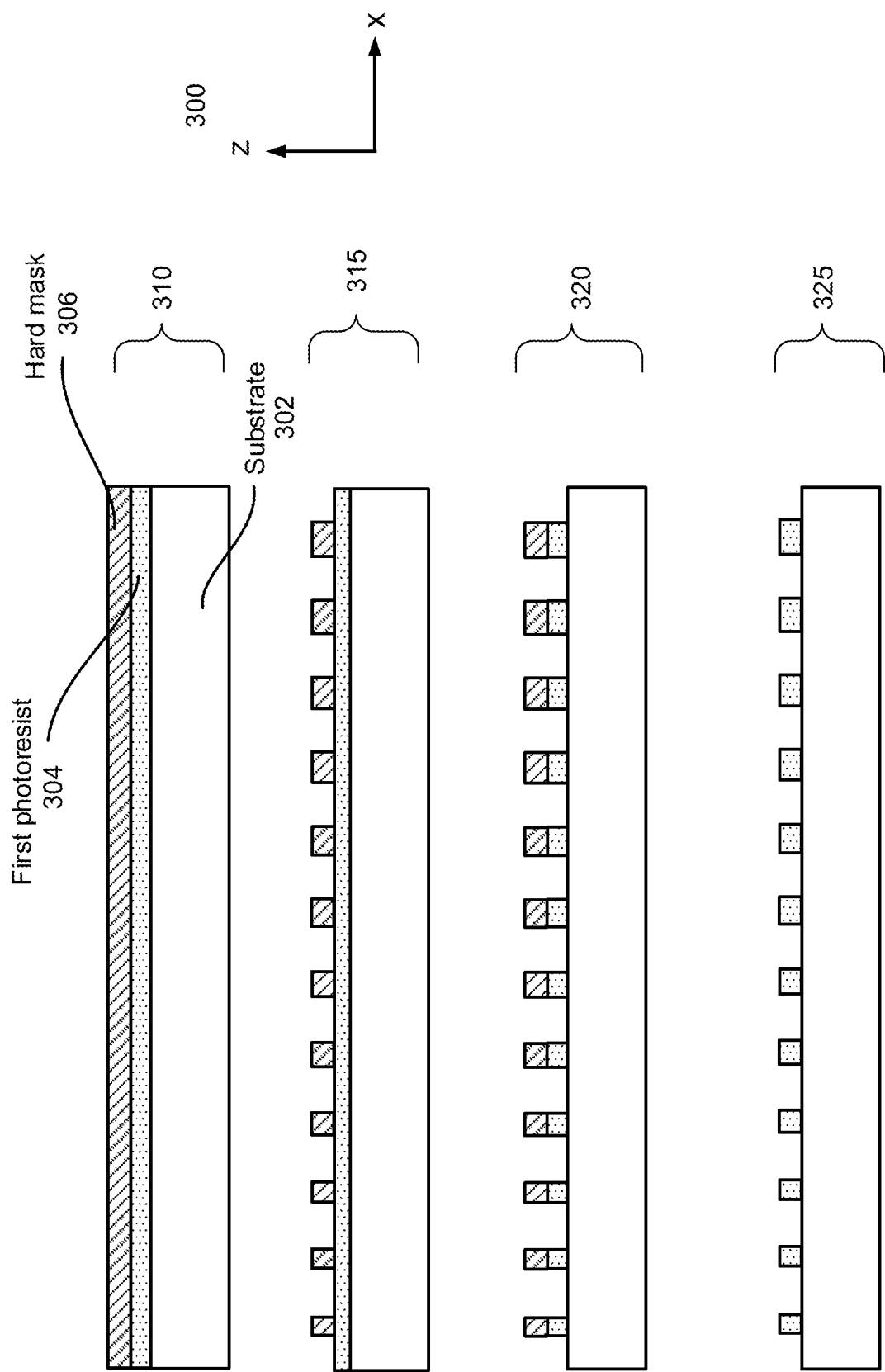
FIG. 3A-C illustrate a process of creating grating elements with a variable height by the manufacturing system of FIG. 1, in accordance with one or more embodiments.
Figure 3B:
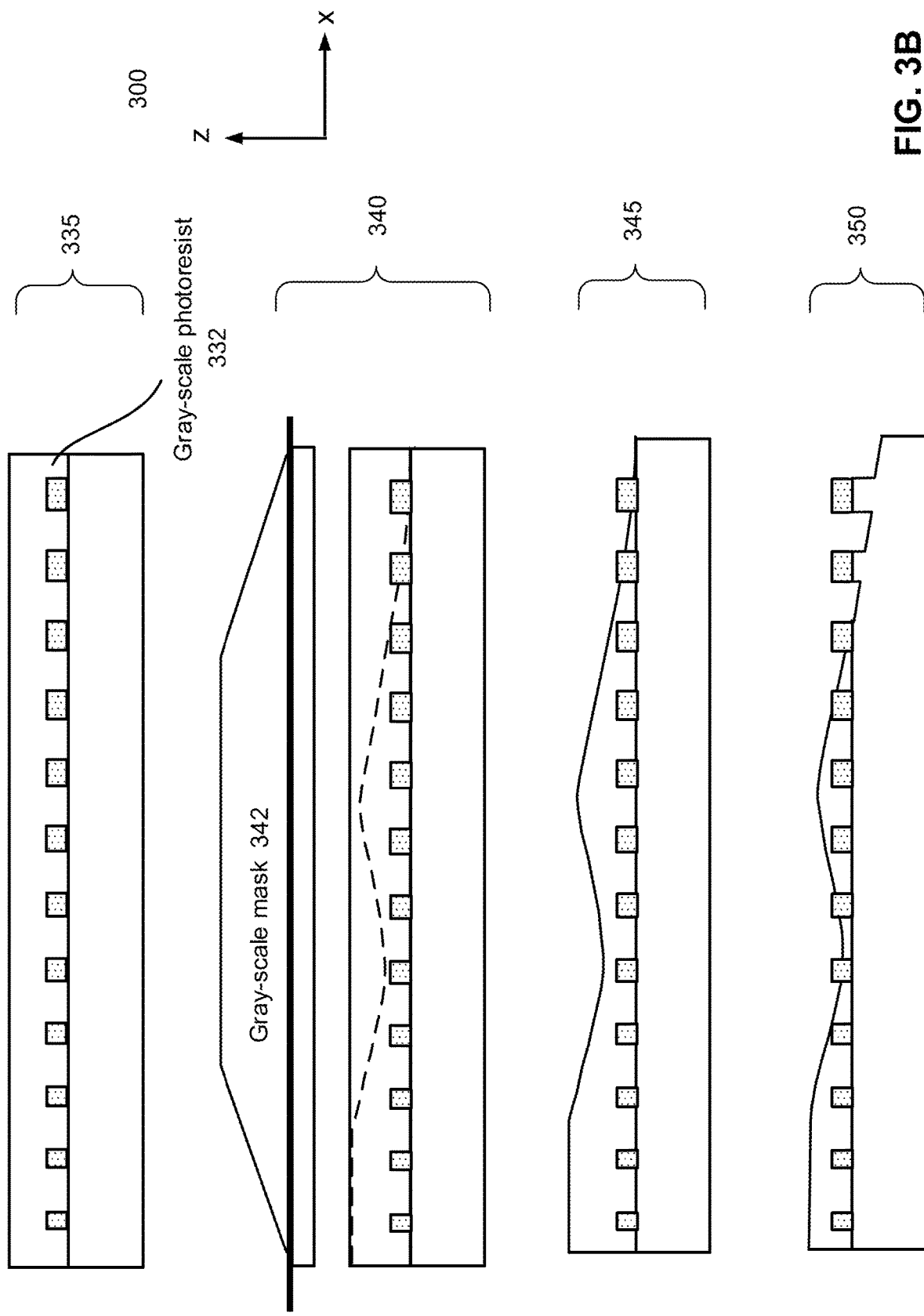
Figure 3C:
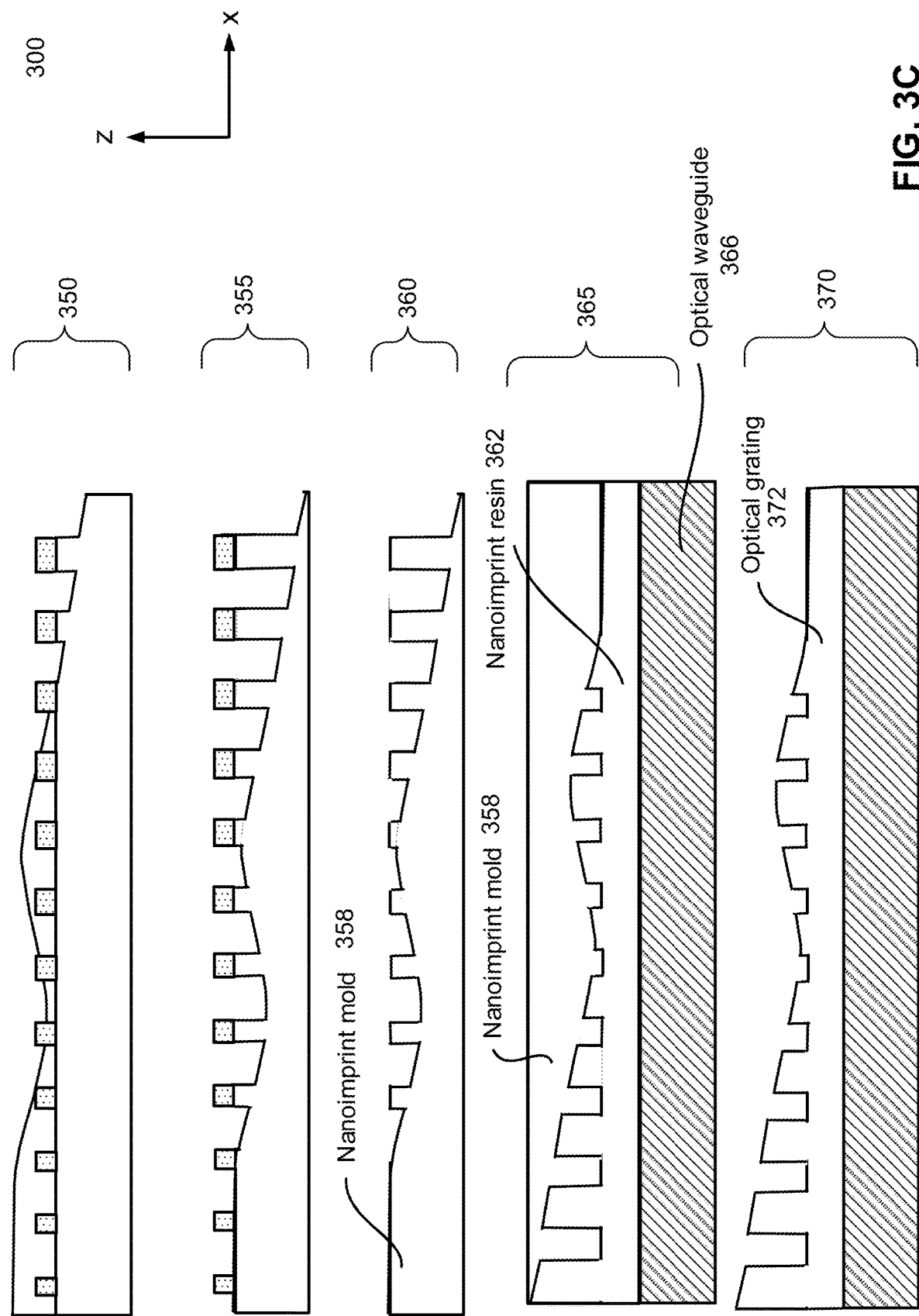

FIG. 3A-C illustrate a process 300 of creating grating elements with a variable height by the manufacturing system of FIG. 1, in accordance with one or more embodiments. The process 300 of FIG. 3A-C may be performed by the manufacturing system 100. Other entities may perform some or all of the steps of the process in other embodiments. Likewise, embodiments may include different and/or additional steps, or perform the steps in different orders.

The manufacturing system 100 performs 310 a deposition of one or more photoresists on a substrate 302. For example, the manufacturing system 100 performs a deposition of a first photoresist 304 on the substrate 302. The manufacturing system 100 performs 310 a deposition of a hard mask 306 over the first photoresist 304. The first photoresist 304 is composed of an organic material such as an imprint resist, a shield resist, etc. In the example of FIG. 3, the first photoresist 304 is a SSQ derivative and the hard mask 306 is a metal layer such as Chrome, Nickel, and Aluminum etc.

The manufacturing system 100 performs 315 a lithographic patterning of the hard mask 306 deposited over the first photoresists 304 that is deposited on the substrate 302. In one example, the patterning system 110 uses a lithographic exposure to pattern the hard mask 306. The etching system 130 selectively removes the lithographically exposed regions of the patterned hard mask 306.

The manufacturing system 100 performs 320 a lithographic patterning of the first photoresists 304 deposited on the substrate 302. In one example, the patterning system 110 uses a lithographic exposure to pattern the first photoresists 304. The etching system 130 selectively removes the lithographically exposed regions of the patterned first photoresists 304. In alternate embodiments, the patterning system 110 uses a single lithographic exposure to pattern the first photoresist 304 and the hard mask 306.

The manufacturing system 100 performs 325 a removal of the hard mask 306. The manufacturing system 100 performs 335 a deposition of a gray-scale photoresist 332. The manufacturing system 100 performs 340 a lithographic patterning of the gray-scale photoresist 332 using a gray-scale mask 342. The gray-scale mask 342 is an optical component that selectively transmits ultra-violet radiation of different levels of intensity to a gray-scale photoresist (e.g. AZ 9260) underneath the gray-scale mask 342. The gray-scale mask 342 modulates the amount of exposure of ultra-violet radiation such that the gray-scale photoresist forms a plurality of heights relative to the substrate after a development process during lithography. The gray-scale mask 342 modulates the height of the developed gray-scale photoresist to different levels, which in turn is transferred on to an organic material (e.g. nanoimprint resin) to produce optical gratings with a plurality of etch depths. In some configurations, the gray-scale mask 342 forms $2^N$ different heights of the gray-scale photoresist with 'N' number of exposure and development process performed by the manufacturing system 100. The gray-scale mask 342 is fabricated by the manufacturing system 100 using methods including, but not restricted to, a laser ablation process, a layer-by-layer deposition, a layerby-layer etching process, etc. More details about the fabrication of the gray-scale mask 342 are described below in detail with reference to FIGS. 4-6.

The manufacturing system 100 performs 345 a partial removal of the patterned gray-scale photoresist 332. The manufacturing system 100 performs 350 a partial removal of the substrate 302. The manufacturing system 100 performs 355 a removal of the gray-scale photoresist 332 and a partial removal of the substrate 302. The manufacturing system 100 performs 360 a removal of the hard mask 306 to form a nanoimprint mold 358. As shown in FIG. 3C, the nanoimprint mold 358 has a plurality of heights with reference to the substrate 302.

The manufacturing system 100 performs 365 a deposition of a nanoimprint resin 362 over the nanoimprint mold 358. The manufacturing system 100 performs 365 the application of the nanoimprint resin 362 over an optical waveguide 366. The manufacturing system 100 removes 370 the nanoimprint mold 358 in order to transfer the pattern in the nanoimprint mold 358 onto an optical grating 372 formed on the optical waveguide 366. As described below with reference to FIG. 9, the optical grating 372 is a grating element with a plurality of heights, one or more duty cycles, or some combination thereof, in waveguide displays used for applications including, but not restricted to, near-eye-displays (NEDs), Head-Mounted Displays (HMDs), etc. Note that conventional lithographic techniques such as photolithography or electron beam lithography cannot modulate the heights of the nanoimprint mold 358, and accordingly, the optical grating formed using such conventional lithographic techniques cannot modulate the heights of the optical grating relative to the substrate. In contrast, the manufacturing system 100 modulates the duty cycles (e.g. 10 percent to 90 percent), heights of the optical grating 372 formed, or some combination thereof.

Figure 4:
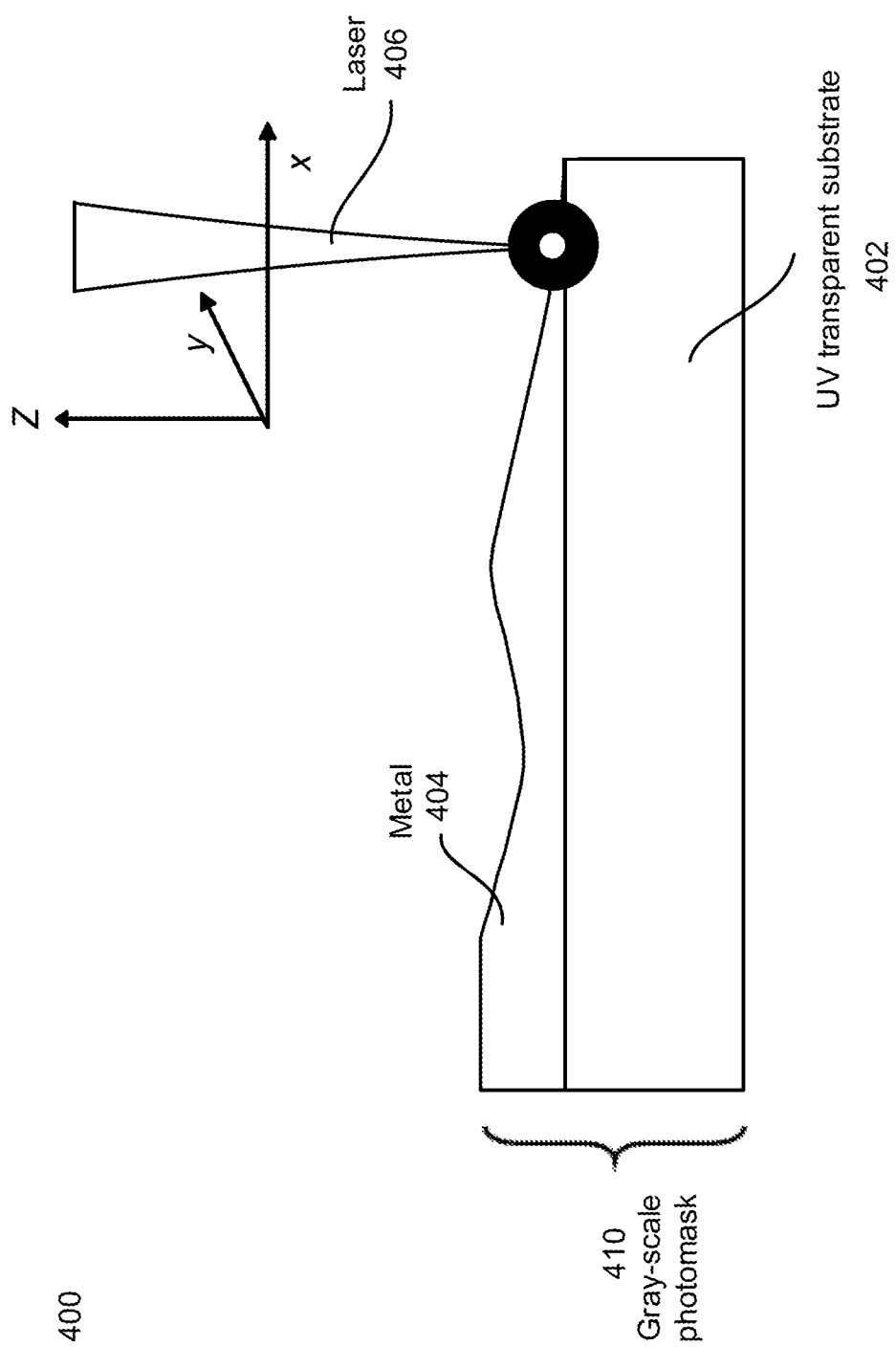
FIG. 4 is an illustration of a laser ablation process for fabricating a gray-scale mask using the manufacturing system of FIG. 1, in accordance with one or more embodiments.

FIG. 4 is an illustration of a laser ablation process 400 for fabricating a gray-scale mask 410 using the manufacturing system 100 of FIG. 1, in accordance with at least one embodiment. The process 400 of FIG. 4 may be performed by the manufacturing system 100. Other entities may perform some or all of the steps of the process in other embodiments. Likewise, embodiments may include different and/or additional steps, or perform the steps in different orders. The gray-scale mask 410 is an embodiment of the gray-scale mask 342 described above with reference to FIG. 3B. The gray-scale mask 410 selectively transmits ultra-violet radiation of different levels of intensity to a photoresist underneath the gray-scale mask 410.

As shown in FIG. 4, the manufacturing system 100 deposits over a UV transparent substrate 402 a metal 404 of a target value of thickness to form the gray-scale mask 410. The UV transparent substrate 402 may be composed of materials including, but not restricted to, soda lime, quartz, fused silica, etc. The metal 404 may be composed of materials including, but not restricted to, chrome, molybdenum, silver, gold, or any other material that can block ultra-violet radiation.

The laser 406 performs a scanning operation on the metal 404 by moving across the X-Y plane to different locations with different speeds (e.g. along the X-direction and the Y-direction) at different time intervals. The manufacturing system 100 includes a controller (not shown here) that controls the intensity and the speed of movement of the laser 406 to achieve a plurality of doses of laser exposure over the exposed area of the metal 404 resulting in a removal of different amounts of the metal 404 across the exposed area. The laser 406 performs a partial erosion of the metal 404 at different locations to yield different levels of opacity of the gray-scale mask 410. The laser ablation process 400 achieves a smooth mask profile on the metal 404 resulting in a uniform variation of ultra-violet radiation transmitted by the gray-scale mask 410. In alternate embodiments, the manufacturing system 100 varies the opacity of the gray-scale mask 410 by varying the thickness of the metal 404 deposited on the UV transparent substrate 402.

Figure 5A:
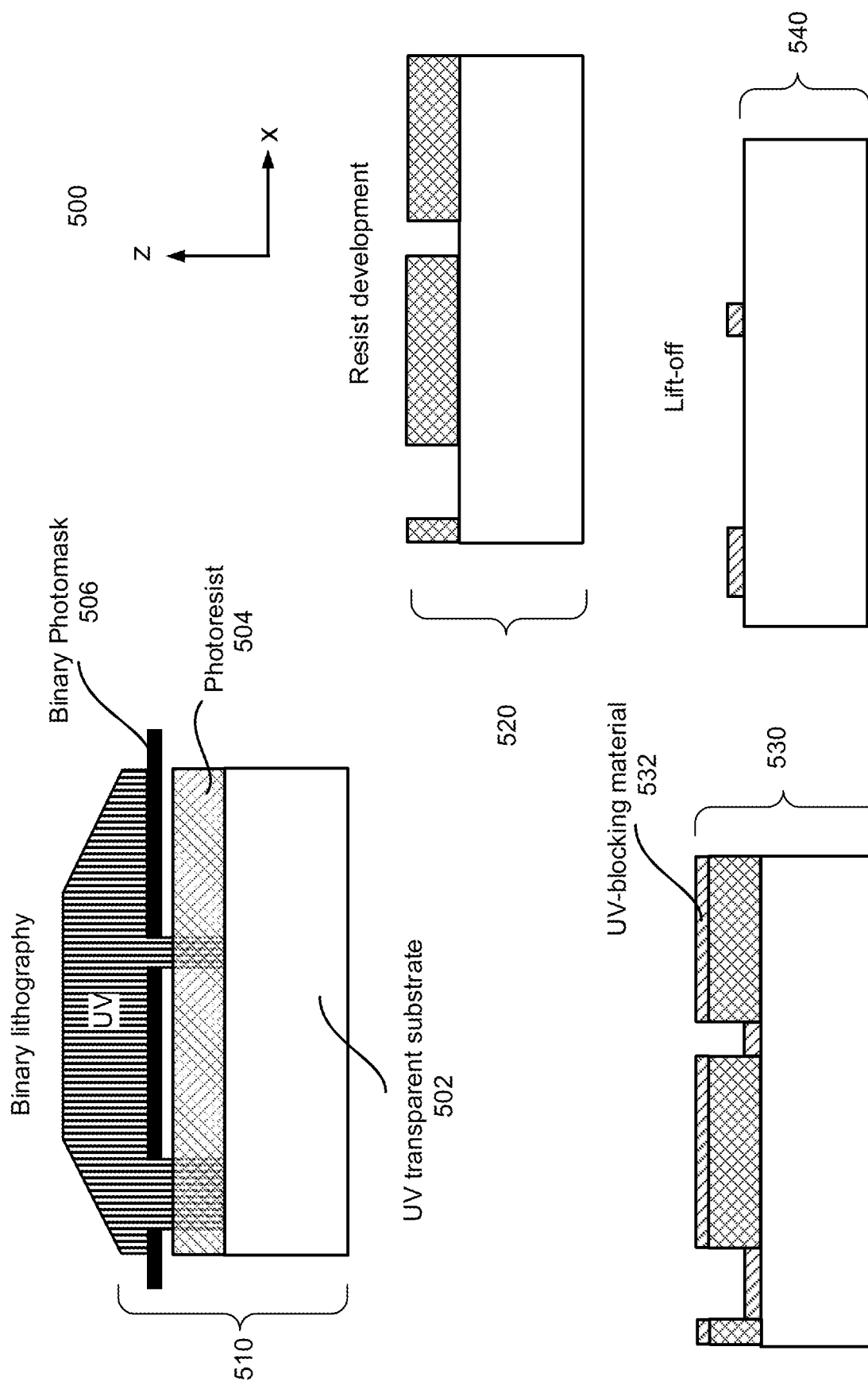
FIG. 5A is an illustration of a layer-by-layer deposition process fabricating a gray-scale mask using the manufacturing system of FIG. 1, in accordance with one or more embodiments.
Figure 5B:
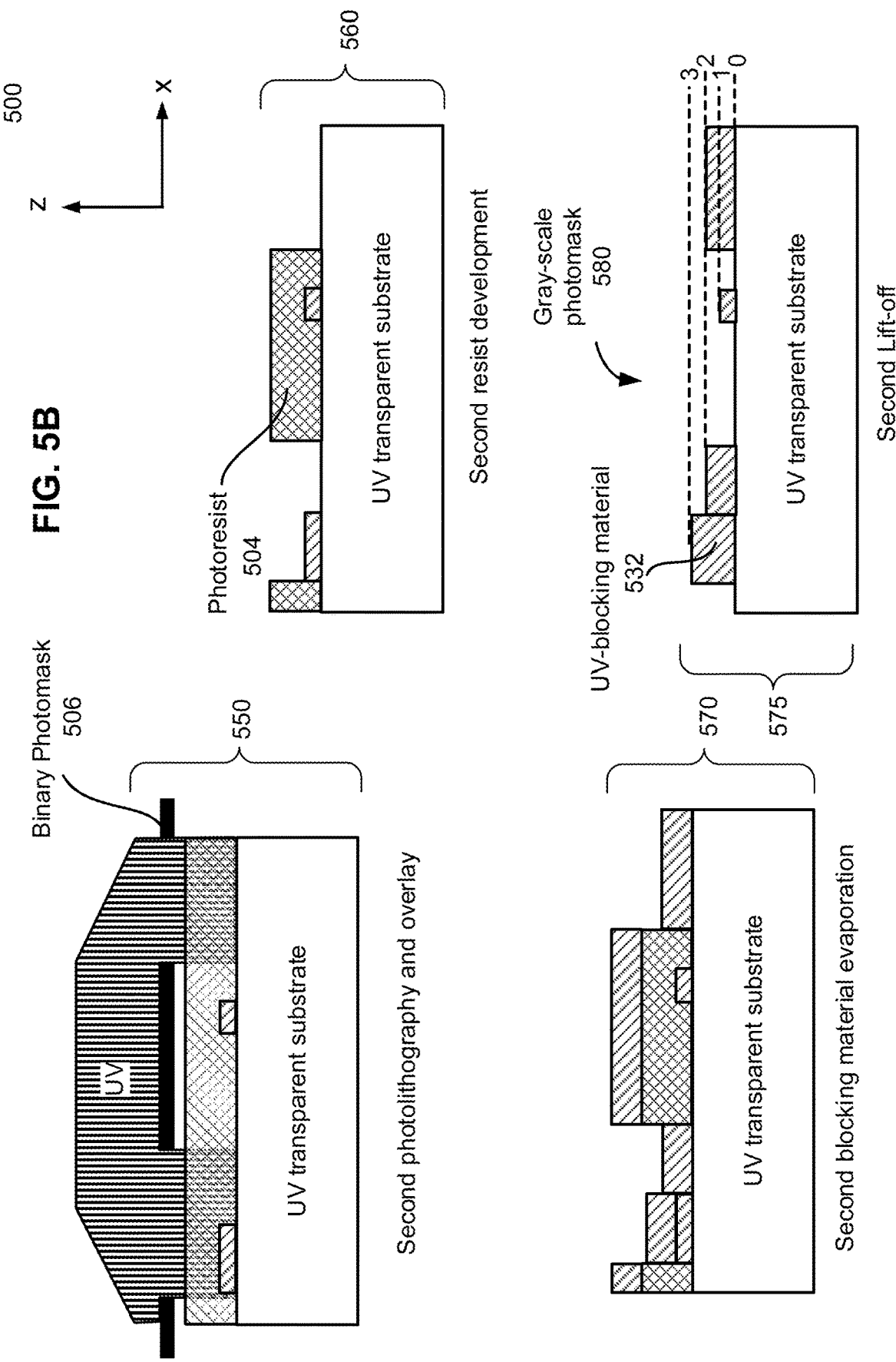
FIG. 5B is an illustration of a layer-by-layer deposition process fabricating a gray-scale mask using the manufacturing system of FIG. 1, in accordance with one or more embodiments.

FIG. 5A-B is an illustration of a layer-by-layer deposition process 500 of creating a gray-scale photomask 580 using the manufacturing system 100 of FIG. 1, in accordance with one or more embodiments. The process 500 of FIG. 5 may be performed by the manufacturing system 100. Other entities may perform some or all of the steps of the process in other embodiments. Likewise, embodiments may include different and/or additional steps, or perform the steps in different orders. The manufacturing system 100 performs the process 500 using, among several other components, a UV transparent substrate 502, a photoresist 504, a binary photomask 506, and a UV-blocking material 532. Referring back to FIG. 3, the UV transparent substrate 502 is an embodiment of the substrate 302, the photoresist 504 is an embodiment of the first photoresist 304, and the binary photomask 506 is an embodiment of the hard mask 306. Referring back to FIG. 4, the UV-blocking material 532 is an embodiment of the metal 404.

The manufacturing system 100 performs 510 a lithographic patterning of the UV transparent substrate 502 deposited with the photoresist 504 using the binary photomask 506. As described above with reference to FIG. 1, the patterning system 110 performs 510 a lithographic patterning of the photoresist 504 deposited by the deposition system 120 over the UV transparent substrate 502. In some embodiments, the manufacturing system 100 performs 510 the lithographic patterning of the photoresist 504 such that the photoresist 504 has a thickness in the range of few hundred nanometers to few microns.

The manufacturing system 100 performs 520 a development of the photoresist 504. For example, the patterning system 110 performs 520 a wet etching of the exposed areas of the photoresist 504 such that a portion of the photoresist 504 gets removed during the development process.

The manufacturing system 100 deposits 530 the UV-blocking material 532 over the developed photoresist 504. As described above with reference to FIG. 1, the deposition system 120 deposits the UV-blocking material 532. The deposition system 120 deposits the UV-blocking material 532 with a thickness ranging from few hundred nanometers to few microns.

The manufacturing system 100 performs 540 a lift-off of the developed photoresist 504 resulting in a partial removal of the UV-blocking material 532. The manufacturing system 100 performs 540 the lift-off of the developed photoresist 504 to form an intermediate gray-scale photomask.

The manufacturing system 100 performs 550 a second lithographic patterning of the photoresist 504 using the binary photomask 506 on the intermediate gray-scale photomask formed. As described above with reference to FIG. 1, the patterning system 110 performs 550 the second lithographic patterning of the photoresist 504 using the binary photomask 506. In some embodiments, the manufacturing system 100 performs 550 the second lithographic patterning of the photoresist 504 such that the photoresist 504 has a thickness in the range of few hundred nanometers to few microns.

The manufacturing system 100 performs 560 a development of the photoresist 504. For example, the patterning system 110 performs 560 a wet etching of the exposed areas of the photoresist 504 such that a portion of the photoresist 504 gets removed during the development process.

The manufacturing system 100 deposits 570 the UV-blocking material 532 over the developed photoresist 504. As described above with reference to FIG. 1, the deposition system 120 deposits the UV-blocking material 532. The deposition system 120 deposits the UV-blocking material 532 with a thickness ranging from few hundred nanometers to few microns.

The manufacturing system 100 performs 575 a lift-off of the developed photoresist 504 resulting in a partial removal of the UV-blocking material 532. The manufacturing system 100 performs 575 the lift-off of the developed photoresist 504 to form a gray-scale photomask 580.

In the example of FIG. 5B, the manufacturing system 100 forms the gray-scale photomask 580 with two lithographic patterning steps resulting in four different levels (shown as levels 0, 1, 2 and 3) of the gray-scale photomask 580 with each level corresponding to the thickness of the UV-blocking material 532 deposited during the process 500. Note that the process 500 may be repeated with more than two lithographic patterning steps to form the gray-scale photomask 580 with a target number of levels according to the target opacity of the gray-scale photomask 580. In the illustrated example, the manufacturing system 100 forms the gray-scale photomask 580 with four different heights. In alternate examples, the gray-scale photomask 580 may include a plurality of pillars of the UV-locking material 532 that each have a respective height measured from the UV transparent substrate 502. And at least one, and generally more than one pillar, has height that is different from at least one other column of the plurality of pillars. The gray-scale photomask 580 is used to fabricate optical gratings with four different etch depths (e.g. few hundred nanometers to a few microns), one or more duty cycles (e.g. 10 percent to 90 percent), or some combination thereof. Such optical gratings cannot be formed using conventional lithographic techniques.

Figure 6A:
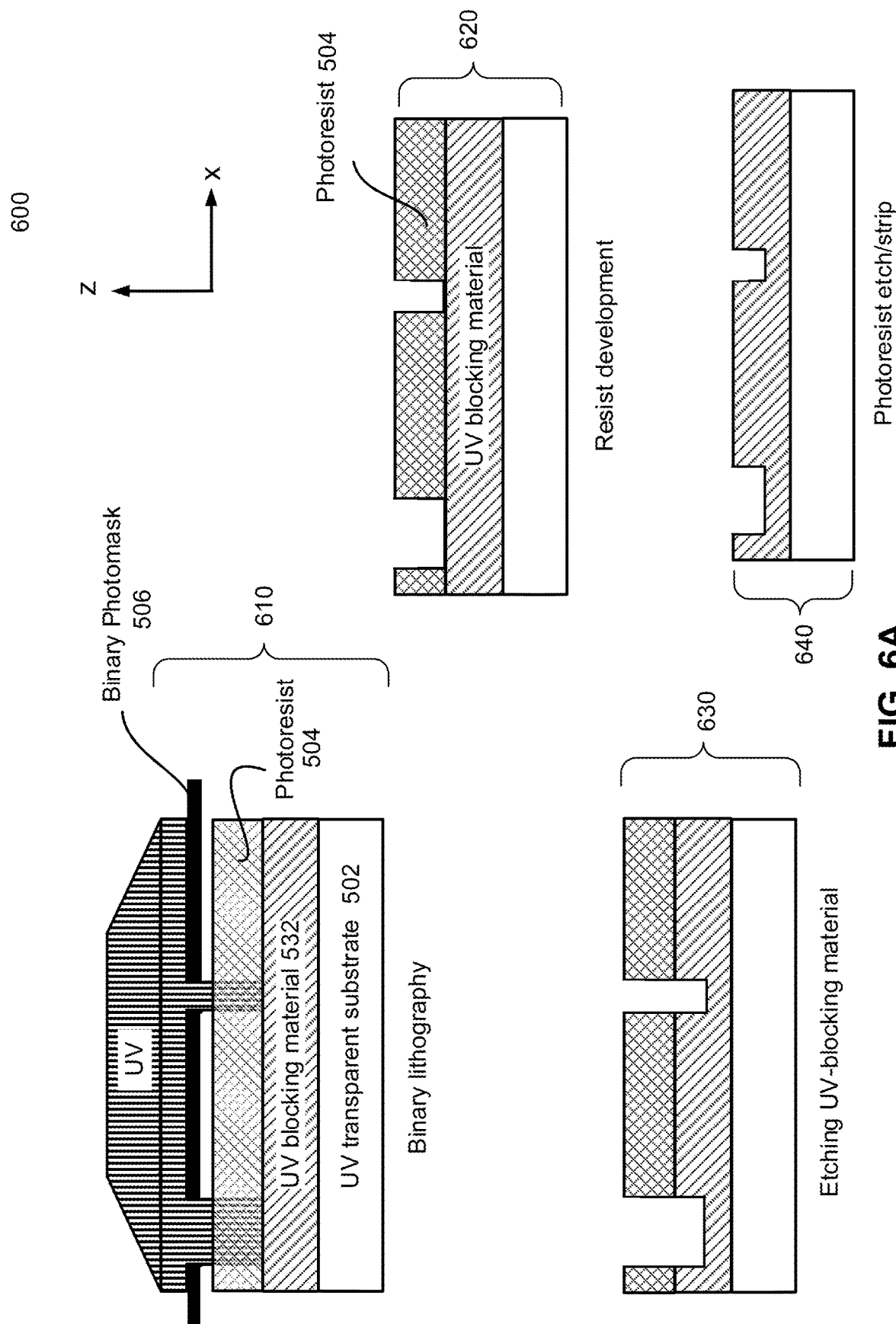
FIG. 6A is an illustration of a layer-by-layer etching process fabricating a gray-scale mask using the manufacturing system of FIG. 1, in accordance with one or more embodiments.
Figure 6B:
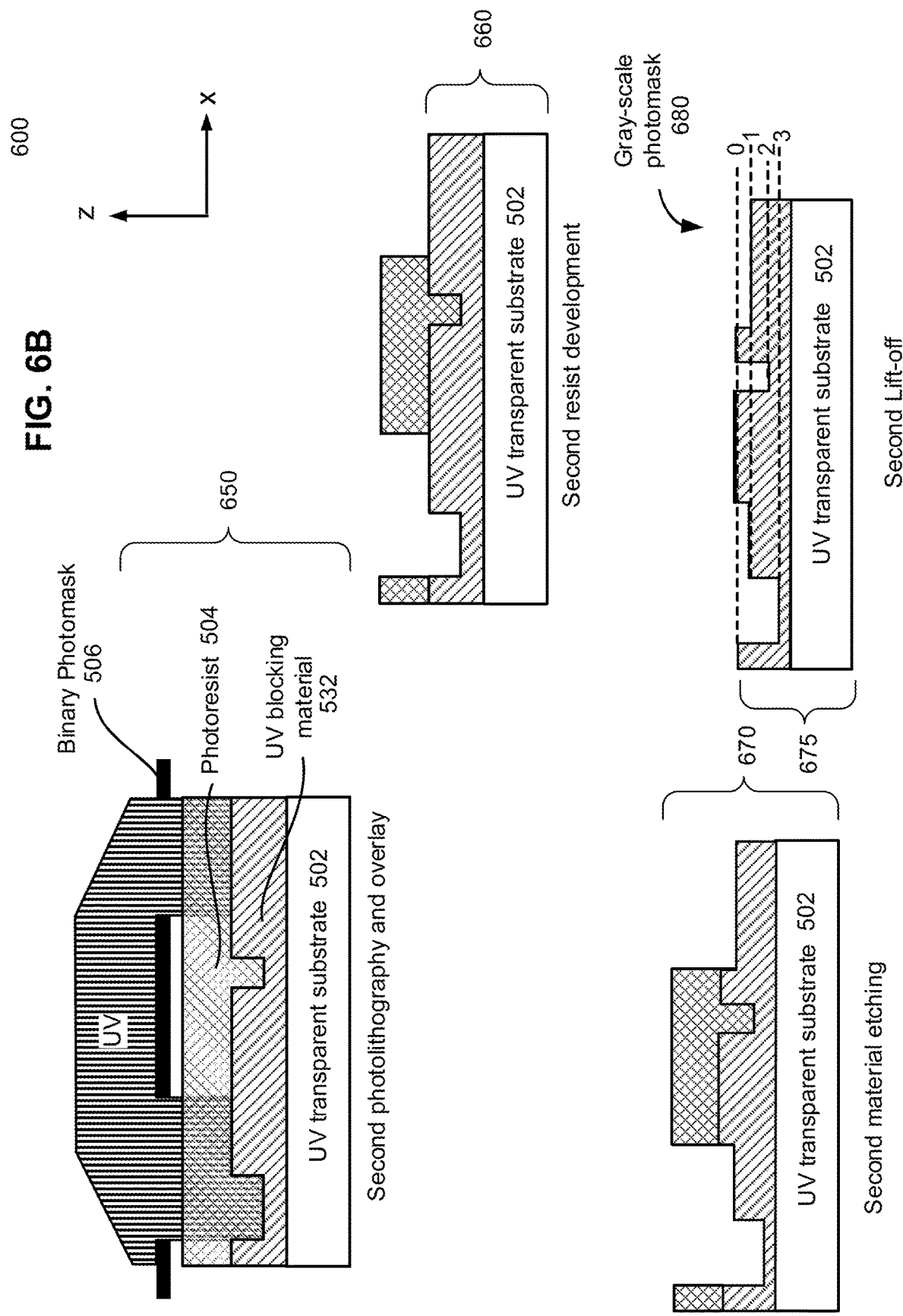
FIG. 6B is an illustration of a layer-by-layer etching process fabricating a gray-scale mask using the manufacturing system of FIG. 1, in accordance with one or more embodiments.

FIG. 6A-B is an illustration of a layer-by-layer etching process 600 of creating a gray-scale photomask 680 using the manufacturing system of FIG. 1, in accordance with one or more embodiments. The process 600 of FIG. 6 may be performed by the manufacturing system 100. Other entities may perform some or all of the steps of the process in other embodiments. Likewise, embodiments may include different and/or additional steps, or perform the steps in different orders. Referring back to FIG. 5A, the manufacturing system 100 performs the process 600 using, among several other components, the UV transparent substrate 502, the photoresist 504, the binary photomask 506, and the UV-blocking material 532.

The manufacturing system 100 performs 610 a lithographic patterning using the binary photomask 506 on the photoresist 504 deposited over the UV-blocking material 532 coated on the UV transparent substrate 502. Note that the process 600 includes the deposition of the photoresist 504 directly on the UV-blocking material 532 unlike the process 500 described above with reference to FIG. 5A.

The manufacturing system 100 performs 620 a development of the photoresist 504. For example, the patterning system 110 performs 620 a wet etching of the exposed areas of the photoresist 504 such that a portion of the photoresist 504 gets removed during the development process.

The manufacturing system 100 performs 630 a partial removal of the UV-blocking material 532 using the developed photoresist 504 as an etch mask. In one example, the manufacturing system 100 performs 630 the partial removal of the UV-blocking material 532 based on a dry etch process (e.g. reactive-ion-etching, ion milling, etc.). The manufacturing system 100 performs 630 the partial removal of the UV-blocking material 532 such that the thickness of the UV-blocking material 532 is in the range of few hundred nanometers to few microns. The manufacturing system 100 performs 640 a selective removal of the developed photoresist 504 to form an intermediate gray-scale photomask. In one example, the manufacturing system 100 performs 640 the selective removal of the developed photoresist 504 based on a wet etching of the developed photoresist 504.

The manufacturing system 100 performs 650 a second lithographic patterning of the photoresist 504 using the binary photomask 506 on the intermediate gray-scale photomask formed. As described above with reference to FIG. 1, the patterning system 110 performs 650 a lithographic patterning of the photoresist 504 deposited by the deposition system 120. In some embodiments, the manufacturing system 100 performs 650 the lithographic patterning of the photoresist 504 using the binary photomask 506 such that the photoresist 504 has a thickness in the range of few hundred nanometers to few microns.

The manufacturing system 100 performs 660 a development of the photoresist 504. For example, the patterning system 110 performs 660 a wet etching of the exposed areas of the photoresist 504 such that a portion of the photoresist 504 gets removed during the development process.

The manufacturing system 100 performs 670 a partial removal the UV-blocking material 532 using the developed photoresist 504 as an etch mask. The manufacturing system 100 performs 675 the lift-off of the developed photoresist 504 to form a gray-scale photomask 680.

In the example of FIG. 6B, the manufacturing system 100 forms the gray-scale photomask 680 with two lithographic patterning steps resulting in four different levels (shown as levels 0, 1, 2 and 3) of the gray-scale photomask 680 with each level corresponding to the etch depth after partial removal of the UV-blocking material 532 deposited during the process 600. Note that the process 600 may be repeated with more than two lithographic patterning steps to form the gray-scale photomask 680 with a target number of levels according to the target opacity of the gray-scale photomask. The manufacturing system 100 forms the gray-scale photomask 680 with a plurality of heights which is used to fabricate optical gratings with the plurality of heights, one or more duty cycles (e.g. 10 percent to 90 percent), or some combination thereof. Such optical gratings cannot be formed using conventional lithographic techniques. In alternate examples, the gray-scale photomask 680 may include a plurality of pillars of the UV-locking material 532 that each have a respective height measured from the UV transparent substrate 502. And at least one, and generally more than one column, has height that is different from at least one other column of the plurality of columns.

Figure 7:
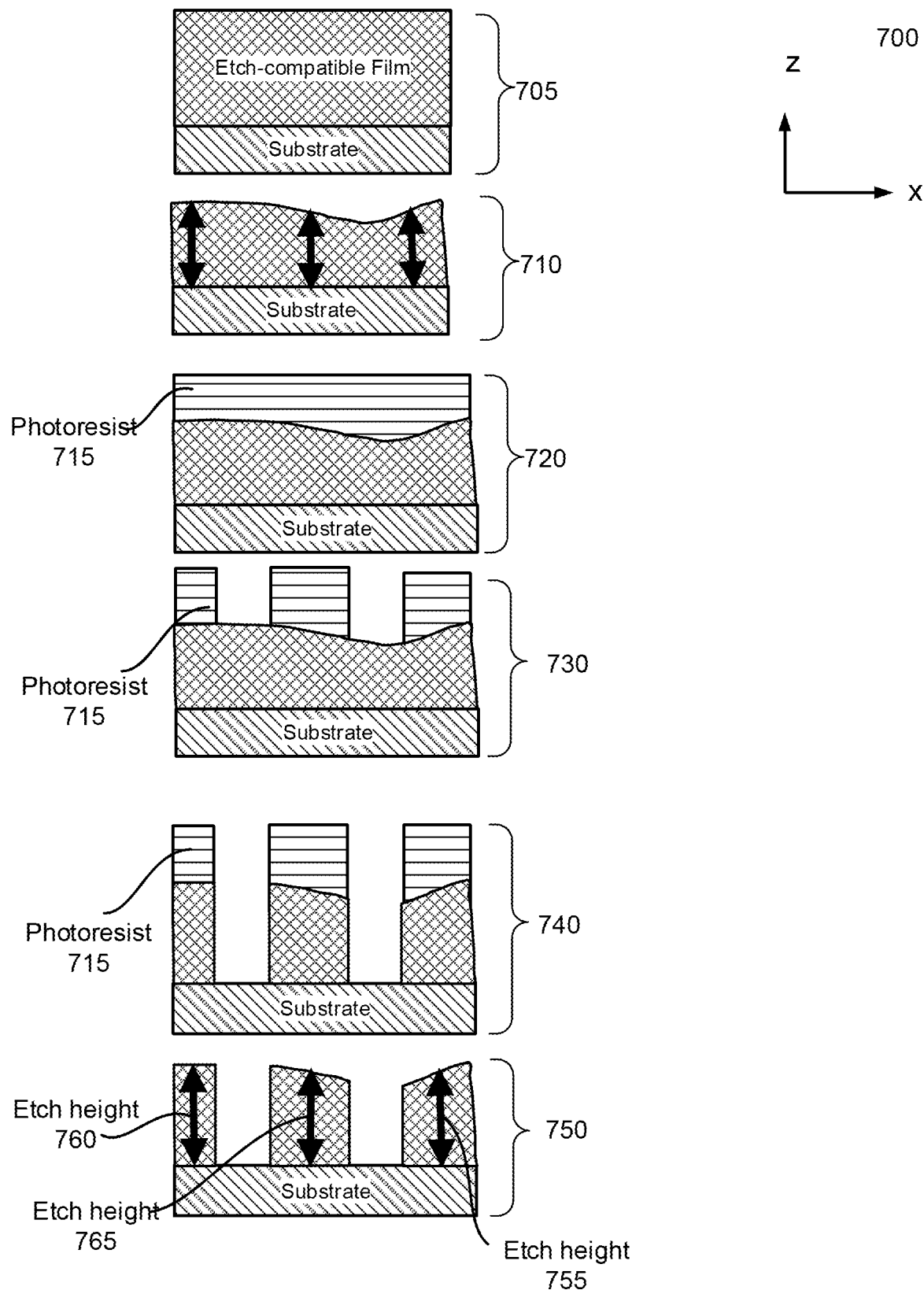
FIG. 7 is an illustration of a process of creating an optical grating with a variable height and/or one or more duty cycles using the manufacturing system of FIG. 1, in accordance with one or more embodiments.

FIG. 7 is an illustration of a process 700 of creating an optical grating with a variable height and/or duty cycles using the manufacturing system 100 of FIG. 1, in accordance with one or more embodiments. The process 700 of FIG. 7 may be performed by the manufacturing system 100. Other entities may perform some or all of the steps of the process in other embodiments. Likewise, embodiments may include different and/or additional steps, or perform the steps in different orders.

The manufacturing system 100 deposits 705 an etch-compatible film over a substrate. As described above with reference to FIG. 1, the deposition system 100 deposits the etch-compatible film of a target value of thickness over a substrate. The etch-compatible film may be composed of materials including, but not restricted to, epoxy resins (e.g. SU-8), novolac resins, etc.

The manufacturing system 100 performs 710 a location-specific partial removal of the etch-compatible film according to a target range of heights of an optical grating. In some configurations, the manufacturing system 100 uses an ion-beam assisted etching tool to partially remove the etch-compatible film at one or more locations. The manufacturing system 100 may also include a controller (not shown here) that generates etch instructions in accordance with a target design of an optical grating and provides the etch instructions to the etching system 130 to perform a partial removal of the etch-compatible film.

The manufacturing system 100 deposits 720 a photoresist 715 on the etched etch-compatible film. The photoresist 715 is an embodiment of the first photoresist 304 of FIG. 3A. As described above with reference to FIG. 1, the deposition system 120 deposits the photoresist 715 comprising one or more layers of SSQ derivatives, an organic polymer, or some combination thereof. The deposition system 120 deposits the photoresist 715 with a thickness ranging from few hundred nanometers to few microns.

The manufacturing system 100 performs 730 a lithographic patterning of the photoresist 715. Note that the manufacturing system 100 performs 730 the lithographic patterning of the photoresist 715 in accordance with a target range of values of duty cycle of the optical grating. For example, the target range of values of duty cycles is from 10 percent to 90 percent.

The manufacturing system 100 performs 740 a selective removal of the etch-compatible film using the lithographically patterned photoresist 715 as an etch mask. In one example, the manufacturing system 100 performs 740 the selective removal of the etch-compatible film based on a dry etching process (e.g. ion milling, reactive ion etching).

The manufacturing system 100 selectively removes 750 the patterned photoresist 715 to form an optical grating with a variable height and/or one or more duty cycles. In the example of FIG. 7, the manufacturing system 100 forms the optical grating with an etch height 755, an etch height 760, and an etch height 765 relative to the substrate. In some embodiments, each of the etch heights 755, 760, and 765 is a root mean square (RMS) value of the height of the optical grating with respect to the substrate, and are in the range of few hundred nanometers to few microns. In the example of FIG. 7, the optical grating includes a plurality of pillars of the etch-compatible film that each have a respective height measured from the substrate. And at least one, and generally more than one pillar, has height that is different from at least one other pillar of the plurality of pillars. Accordingly, the process 700 adjusts the shape, refractive index, height and/or duty cycle of the optical grating allowing for full control of the brightness, uniformity, field-of-view, and efficiency of an image light projected to a user's eye.

Figure 8:
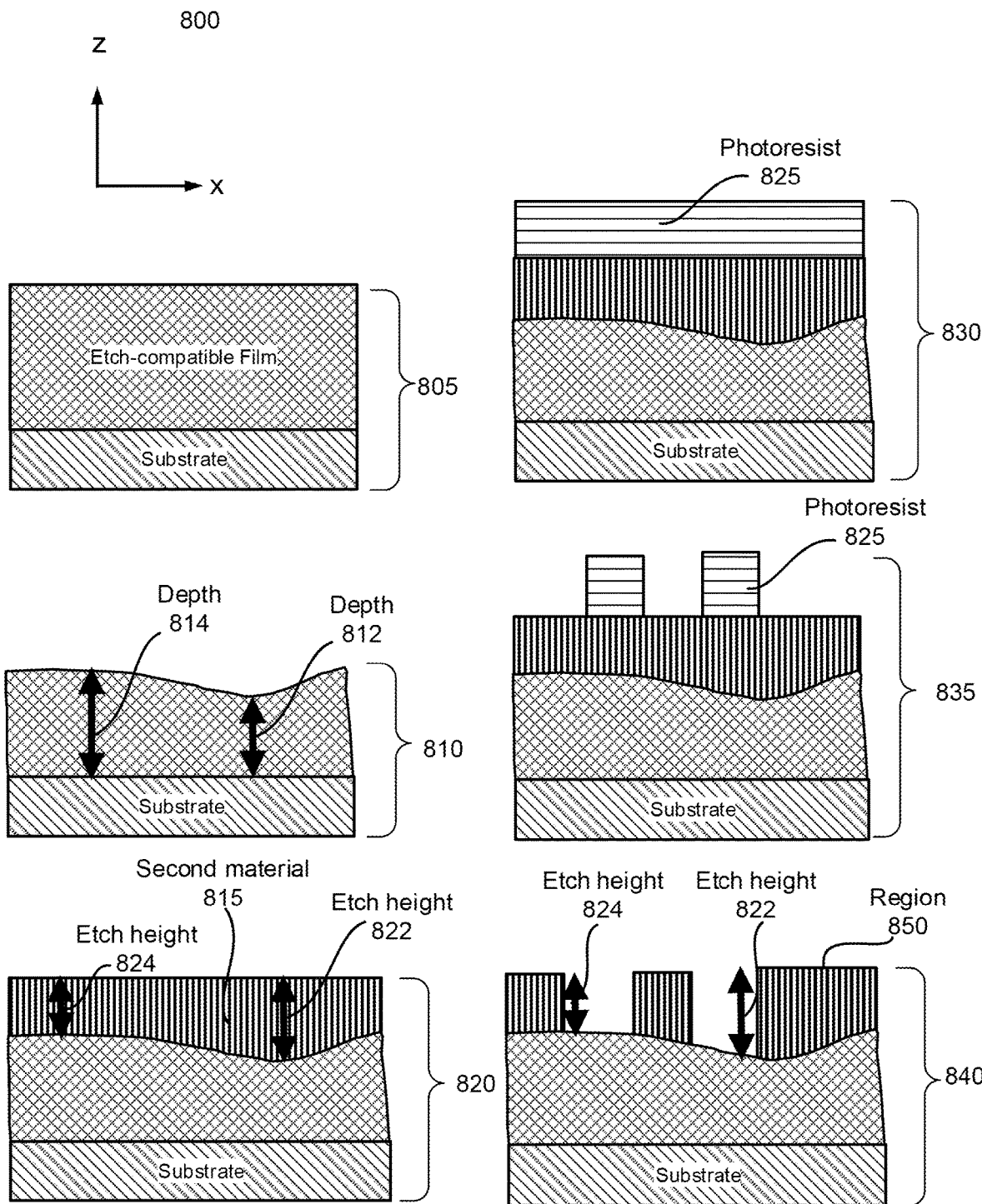
FIG. 8 is an illustration of a process of creating an optical grating with a variable height and/or one or more duty cycles using the manufacturing system of FIG. 1, in accordance with one or more embodiments.

FIG. 8 is an illustration of a process of creating an optical grating with a variable height and/or duty cycles using the manufacturing system of FIG. 1, in accordance with one or more embodiments. The process 800 of FIG. 8 may be performed by the manufacturing system 100. Other entities may perform some or all of the steps of the process in other embodiments. Likewise, embodiments may include different and/or additional steps, or perform the steps in different orders.

The manufacturing system 100 deposits 805 an etch-compatible film over a substrate. As described above with reference to FIG. 1, the deposition system 100 deposits the etch-compatible film of a target value of thickness over a substrate. The etch-compatible film may be composed of materials including, but not restricted to, epoxy resins (e.g. SU-8), novolac resins, etc.

The manufacturing system 100 performs 810 a location-specific partial removal of the etch-compatible film according to a target range of heights of an optical grating. In some configurations, the manufacturing system 100 uses an ion-beam assisted etching tool to partially remove the etch-compatible film at one or more locations. The manufacturing system 100 may also include a controller (not shown here) that generates etch instructions in accordance with a target design of an optical grating and provides the etch instructions to the etching system 130 to perform a partial removal of the etch-compatible film.

The manufacturing system 100 deposits 820 a second material 815 on the partially removed etch-compatible film and performs a partial removal of the second material 815. In one example, the manufacturing system 100 performs a chemical mechanical polishing of the deposited second material 815 to achieve a target value of thickness and surface roughness of the second material 815. The second material 815 may be composed of materials including but not restricted to, an epoxy resin, a novolac resin, or some combination thereof.

The manufacturing system 100 deposits 830 a photoresist 825 on the polished surface of the second material 815. The photoresist 825 is an embodiment of the first photoresist 304 of FIG. 3A. As described above with reference to FIG. 1, the deposition system 120 deposits the photoresist 825 comprising one or more layers of SSQ derivatives, an organic polymer, or some combination thereof. The deposition system 120 deposits the photoresist 825 with a thickness ranging from few hundred nanometers to few microns.

The manufacturing system 100 performs 835 a lithographic patterning of the photoresist 825. Note that the manufacturing system 100 performs 835 the lithographic patterning of the photoresist 825 in accordance with a target range of values of duty cycle of the optical grating. For example, the target range of duty cycles is in the range of 10 percent to 90 percent.

The manufacturing system 100 performs 840 a selective removal of the second material 815 using the lithographically patterned photoresist 825 as an etch mask. In one example, the manufacturing system 100 performs 840 the selective removal of the second material 815 based on a dry etching process (e.g. ion milling, reactive ion etching).

The manufacturing system 100 selectively removes the patterned photoresist 825 to form an optical grating with a variable height and/or one or more duty cycles. In the example of FIG. 8, the manufacturing system 100 forms the optical grating with an etch height 822 and an etch height 824 relative to the etch-compatible film deposited over the substrate. In some embodiments, each of the etch heights 822, and 824 is a root mean square (RMS) value of the height of the second material 815 with respect to the etch-compatible film, and are in the range of few hundred nanometers to few microns. In the example of FIG. 8, the optical grating includes a plurality of pillars of the second material 815 that each have a respective height measured from the etch-compatible film. And at least one, and generally more than one pillar, has height that is different from at least one other pillar of the plurality of pillars. Accordingly, the process 800 adjusts the shape, refractive index, height and/or duty cycle of the optical grating allowing for full control of the brightness, uniformity, field-of-view, and efficiency of an image light projected to a user's eye.

Note that in the absence of the second material 815, the optical grating formed by the process 800 will have an uneven surface at a region 850 of the optical grating that interfaces with air.

Figure 9:
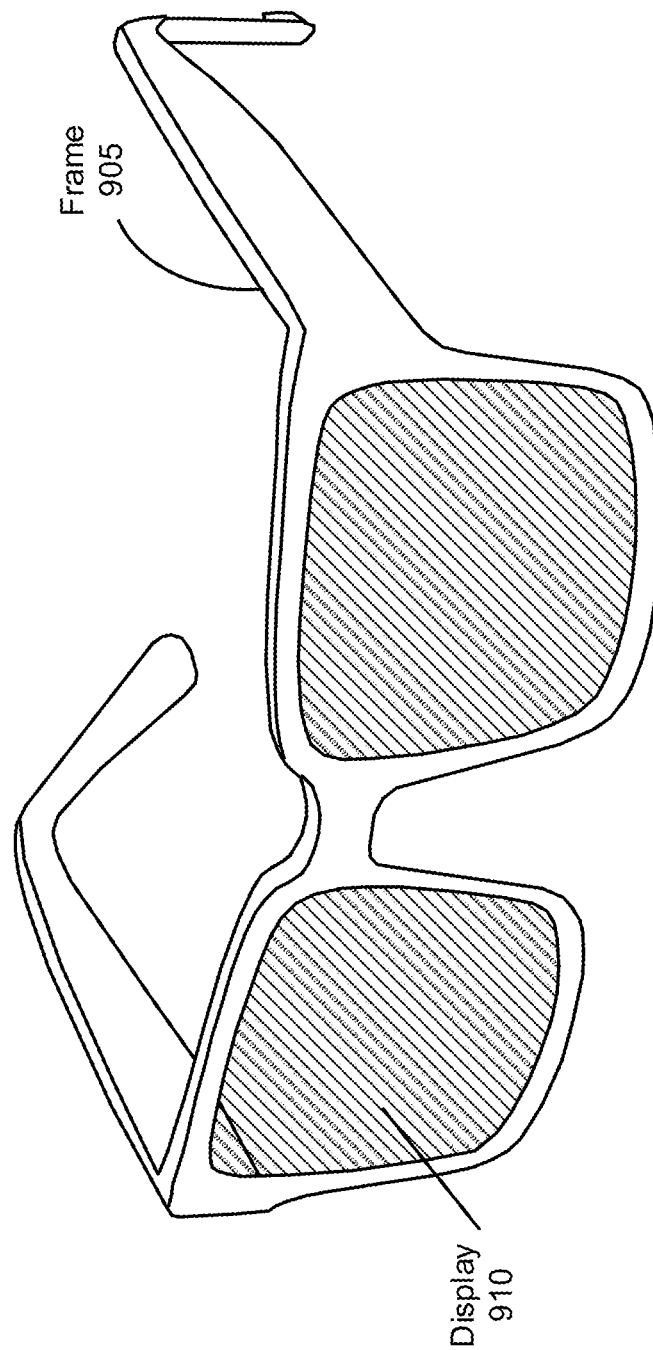
FIG. 9 is a diagram of a near-eye-display (NED) with optical grating fabricated using the manufacturing system of FIG. 1, in accordance with one or more embodiments.

FIG. 9 is a diagram of a near-eye-display (NED) 900 that includes components fabricated using the manufacturing system of FIG. 1, in accordance with one or more embodiments. The NED includes one or more displays 910 that include optical gratings with variable heights and/or duty cycles fabricated using the manufacturing system 100, in accordance with an embodiment. The NED 900 presents media to a user. Examples of media presented by the NED 900 include one or more images, video, audio, or some combination thereof. In some embodiments, audio is presented via an external device (e.g., speakers and/or headphones) that receives audio information from the NED 900, a console (not shown), or both, and presents audio data based on the audio information. The NED 900 is generally configured to operate as a VR NED. However, in some embodiments, the NED 900 may be modified to also operate as an augmented reality (AR) NED, a mixed reality (MR) NED, or some combination thereof. For example, in some embodiments, the NED 900 may augment views of a physical, real-world environment with computer-generated elements (e.g., images, video, sound, etc.).

The NED 900 shown in FIG. 9 includes a frame 905 and a display 910. The frame 905 includes one or more optical elements which together display media to users. The display 910 is configured for users to see the content presented by the NED 900.

FIG. 9 is only an example of an artificial reality system. However, in alternate embodiments, FIG. 9 may also be referred to as a Head-Mounted-Display (HMD).

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method comprising:
   performing a deposition of an etch-compatible film over a substrate, the etch-compatible film comprising a first surface and a second surface opposite to the first surface;
   performing a partial removal of the etch-compatible film to create a surface profile on the first surface with a plurality of different etch heights relative to the substrate;
   performing a deposition of a photoresist over the first surface having the surface profile;
   performing a lithographic patterning of the photoresist deposited over the first surface;
   performing a selective removal of the etch-compatible film using the lithographically patterned photoresist to obtain the plurality of different etch heights relative to the substrate and one or more duty cycles corresponding to the etch-compatible film; and
   selectively removing the lithographically patterned photoresist to form an optical grating including a portion of the etch-compatible film with the plurality of different etch heights relative to the substrate and the one or more duty cycles corresponding to the etch-compatible film.

2. The method of claim 1, wherein the partial removal of the etch-compatible film is based on an etching of the etch-compatible film at one or more locations on the first surface to create the surface profile.

3. The method of claim 1, wherein the etch-compatible film is composed of at least one of: an epoxy resin, a novolac resin, or some combination thereof.

4. The method of claim 1, wherein the plurality of etch heights are in a range of a few hundred nanometers to a few microns.

5. The method of claim 1, wherein the one or more duty cycles is in a range of 10 percent to 90 percent.

6. The method of claim 1, wherein the etch-compatible film is partially removed to a target thickness in a range of a few hundred nanometers to a few microns.

7. The method of claim 1, wherein the etch-compatible film is partially removed by a Gas Cluster Ion Beams (GCIB) process bombarding the first surface of the etch-compatible film with a beam of high energy nanoscale cluster ions.

8. A manufacturing system comprising:
- a deposition system configured to perform a deposition of an etch-compatible film over a substrate, the etch-compatible film comprising a first surface and a second surface opposite to the first surface and configured to deposit a photoresist over the first surface after a surface profile is created on the first surface;
- an etching system configured to perform a partial removal of the etch-compatible film to create the surface profile on the first surface with a plurality of etch heights relative to the substrate; and
- a patterning system configured to perform a lithographic patterning of the photoresist deposited over the created profile in the etch-compatible film, to perform a selective removal of the etch-compatible film using the lithographically patterned photoresist to obtain the plurality of different etch heights relative to the substrate and one or more duty cycles corresponding to the etch-compatible film deposited over the substrate, and to selectively remove the lithographically patterned photoresist to form an optical grating including a portion of the etch-compatible film with the plurality of different etch heights relative to the substrate and the one or more duty cycles corresponding to the etch-compatible film.

9. The manufacturing system of claim 8, wherein the etching system performs an etching of the etch-compatible film at one or more locations on the first surface to create the surface profile.

10. The manufacturing system of claim 8, wherein the etch-compatible film is composed of at least one of: an epoxy resin, a novolac resin, or some combination thereof.

11. The manufacturing system of claim 8, wherein the plurality of etch heights is in a range of a few hundred nanometers to a few microns.

12. The manufacturing system of claim 8, wherein the one or more duty cycles is in a range of 10 percent to 90 percent.

13. The manufacturing system of claim 8, wherein the etch-compatible film is partially removed to a target thickness in a range of a few hundred nanometers to a few microns.

14. The manufacturing system of claim 8, wherein the etch-compatible film is partially removed by a Gas Cluster Ion Beams (GCIB) process bombarding the first surface of the etch-compatible film with a beam of high energy nanoscale cluster ions.

15. An optical grating formed by a process comprising steps of:
- performing a deposition of an etch-compatible film over a substrate, the etch-compatible film comprising a first surface and a second surface opposite to the first surface;
- performing a partial removal of the etch-compatible film to create a surface profile on the first surface with a plurality of different etch heights relative to the substrate;
- performing a deposition of a photoresist over the first surface having the surface profile;
- performing a lithographic patterning of the photoresist deposited over the first surface;
- performing a selective removal of the etch-compatible film using the lithographically patterned photoresist to obtain the plurality of different etch heights relative to the substrate and one or more duty cycles corresponding to the etch-compatible film deposited over the substrate; and
- selectively removing the lithographically patterned photoresist to form the optical grating including a portion of the etch-compatible film with the plurality of different etch heights relative to the substrate and the one or more duty cycles corresponding to the etch-compatible film.

16. The optical grating of claim 15, wherein the partial removal of the etch-compatible film is based on an etching of the etch-compatible film at one or more locations on the first surface to create the surface profile.

17. The optical grating of claim 15, wherein the etch-compatible film is composed of at least one of: an epoxy resin, a novolac resin, or some combination thereof.

18. The optical grating of claim 15, wherein the plurality of etch heights are in a range of a few hundred nanometers to a few microns.

19. The optical grating of claim 15, wherein the one or more duty cycles are in a range of 10 percent to 90 percent.

20. The optical grating of claim 15, wherein the etch-compatible film is partially removed to a target thickness in a range of a few hundred nanometers to a few microns.

21. The optical grating of claim 15, wherein the etch-compatible film is partially removed by a Gas Cluster Ion Beams (GCIB) process bombarding the first surface of the etch-compatible film with a beam of high energy nanoscale cluster ions.

* * * * *